United States Patent
Mizuuchi et al.

(10) Patent No.: US 8,270,440 B2
(45) Date of Patent: Sep. 18, 2012

(54) LASER LIGHT SOURCE AND OPTICAL DEVICE

(75) Inventors: Kiminori Mizuuchi, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 300 days.

(21) Appl. No.: 11/918,011

(22) PCT Filed: Apr. 7, 2006

(86) PCT No.: PCT/JP2006/307465
§ 371 (c)(1), (2), (4) Date: Oct. 5, 2007

(87) PCT Pub. No.: WO2006/109730
PCT Pub. Date: Oct. 19, 2006

(65) Prior Publication Data
US 2009/0067453 A1    Mar. 12, 2009

(30) Foreign Application Priority Data
Apr. 7, 2005  (JP) .................. 2005-110597

(51) Int. Cl.
*H01S 3/30* (2006.01)
(52) U.S. Cl. ................. 372/6; 372/41; 372/70
(58) Field of Classification Search .......... 372/6, 39–41, 372/43.01, 66–68, 70–75
See application file for complete search history.

(56) References Cited

U.S. PATENT DOCUMENTS

| | | | | |
|---|---|---|---|---|
| 5,070,507 | A * | 12/1991 | Anthon | 372/41 |
| 5,742,722 | A * | 4/1998 | Imoto | 385/126 |
| 5,774,484 | A | 6/1998 | Wyatt et al. | 372/6 |
| 5,946,093 | A * | 8/1999 | DeFreez et al. | 356/339 |
| 5,991,314 | A * | 11/1999 | Ionov et al. | 372/6 |
| 6,061,170 | A * | 5/2000 | Rice et al. | 372/6 |
| 6,774,881 | B2 | 8/2004 | Karakawa | |
| 2001/0022566 | A1 | 9/2001 | Okazaki | |
| 2001/0022884 | A1 | 9/2001 | Bayart et al. | 385/123 |
| 2002/0031151 | A1* | 3/2002 | Tabirian et al. | 372/39 |

(Continued)

FOREIGN PATENT DOCUMENTS

JP    2000-314920    11/2000
(Continued)

OTHER PUBLICATIONS

Franz X. Kartner et al., "Mode-Locking with Slow and Fast Saturable Absorbers—What's the Difference?," IEEE Journal of Selected Topics in Quantum Electronics, vol. 4, No. 2, pp. 159-167, 1998.*

(Continued)

*Primary Examiner* — Jessica Stultz
*Assistant Examiner* — Xinning Niu
(74) *Attorney, Agent, or Firm* — Steptoe & Johnson LLP

(57) ABSTRACT

A laser light source is provided with a pump light source (1) comprising a semiconductor laser, a solid laser medium (2) which is excited by the semiconductor laser, and multi-mode means for changing at least either a longitudinal mode or a transverse mode of laser oscillation of the solid laser. The oscillation light of the laser medium excited by the light outputted from the pump light source is changed by the multi-mode means into output light (5) having a plurality of oscillation spectra and is outputted, thereby a small, high power, and highly efficient low coherent light source can be realized, and a laser light source having reduced speckle noises can be provided.

22 Claims, 18 Drawing Sheets

U.S. PATENT DOCUMENTS

| | | |
|---|---|---|
| 2002/0122260 A1 | 9/2002 | Okazaki et al. |
| 2002/0154375 A1 | 10/2002 | Roddy et al. |
| 2003/0063629 A1* | 4/2003 | Davis et al. .................. 372/6 |
| 2004/0076203 A1 | 4/2004 | Kaminsky et al. .............. 372/39 |

FOREIGN PATENT DOCUMENTS

| | | |
|---|---|---|
| JP | 2001-264662 | 9/2001 |
| JP | 2002-323675 | 11/2002 |
| JP | 2003-156698 | 5/2003 |
| JP | 2004-144794 | 5/2004 |
| WO | WO 2004/064410 A1 | 7/2004 |

OTHER PUBLICATIONS

J. Song et al. "Thermal influence of saturable absorber in passively Q-switched diode-pumped cw Nd:YAG/Cr4+: YAG laser," Optics Communications 177, pp. 307-316, 2000.*

Liu, A. et al, "60-W Green Output by Frequency Doubling of a Polarized Yb-doped Fiber Laser," OPTICS LETTERS, Jan. 1, 2005, vol. 20, No. 1, pp. 67-69.

* cited by examiner

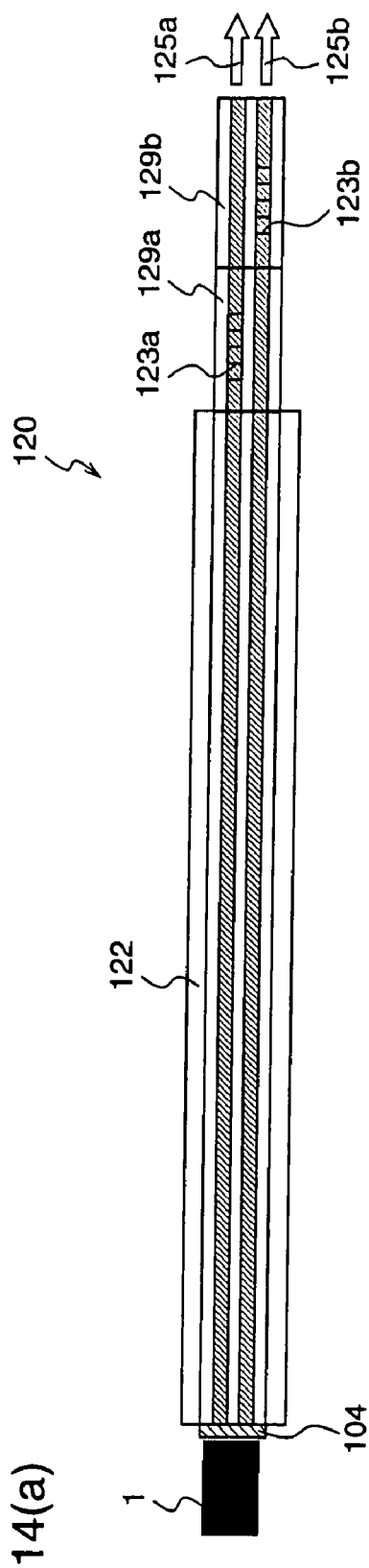
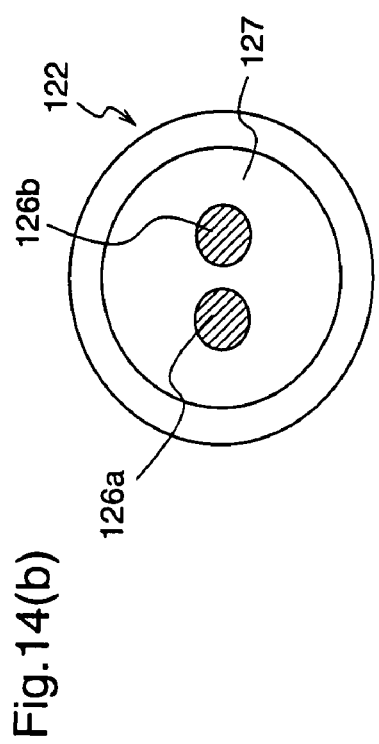
Fig.14(a)
Fig.14(b)

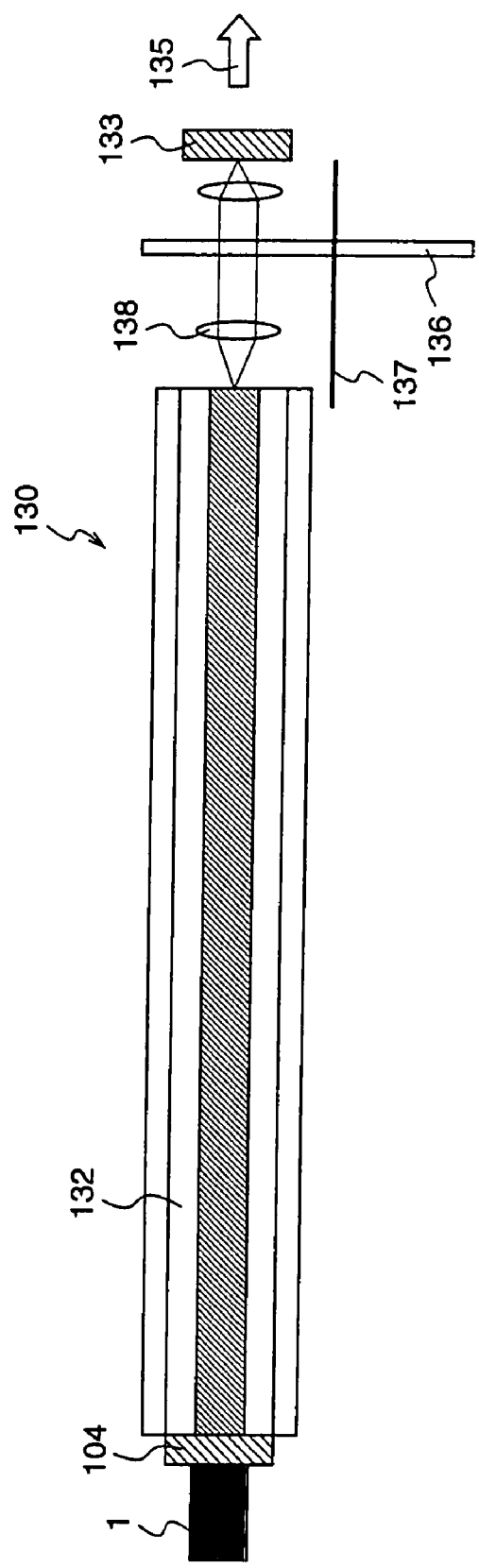

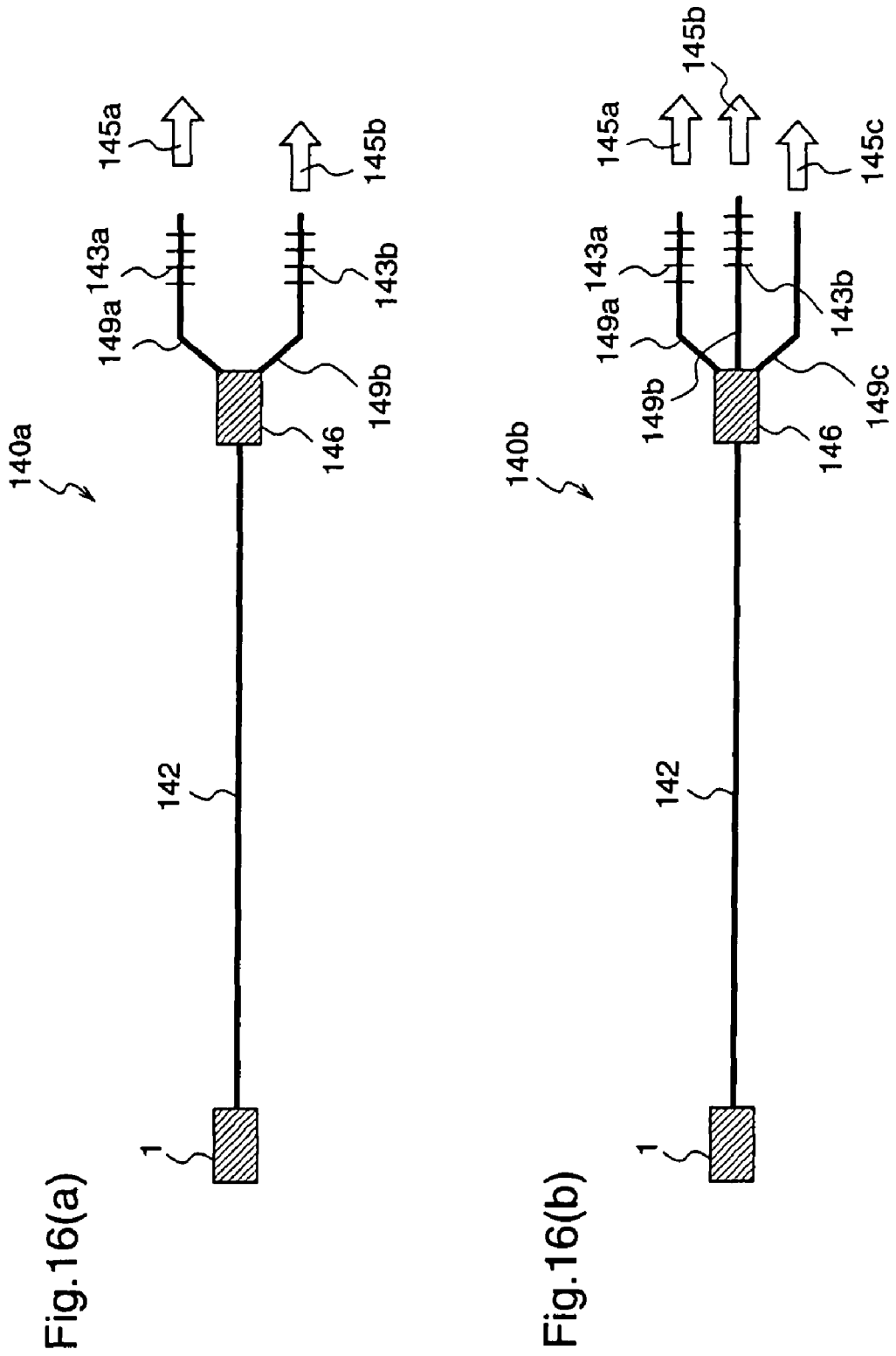

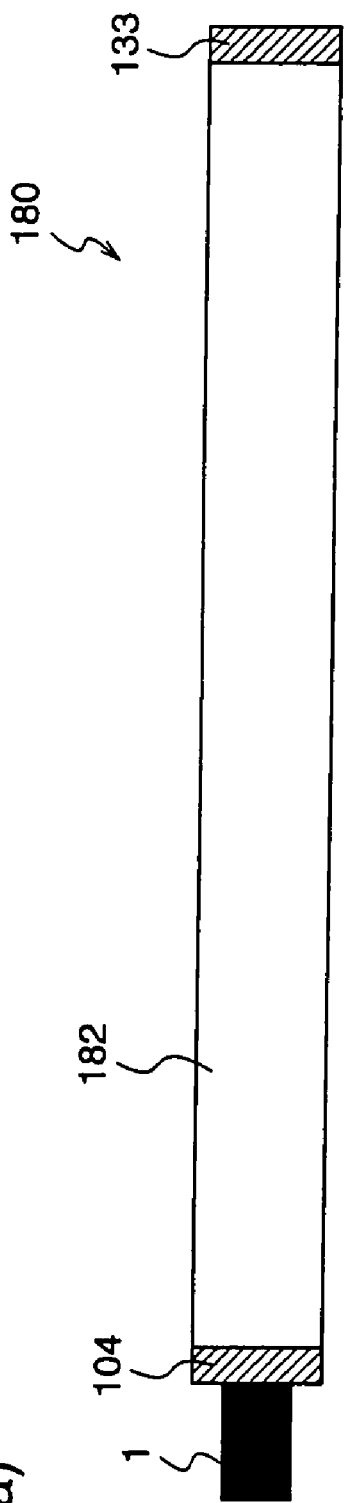
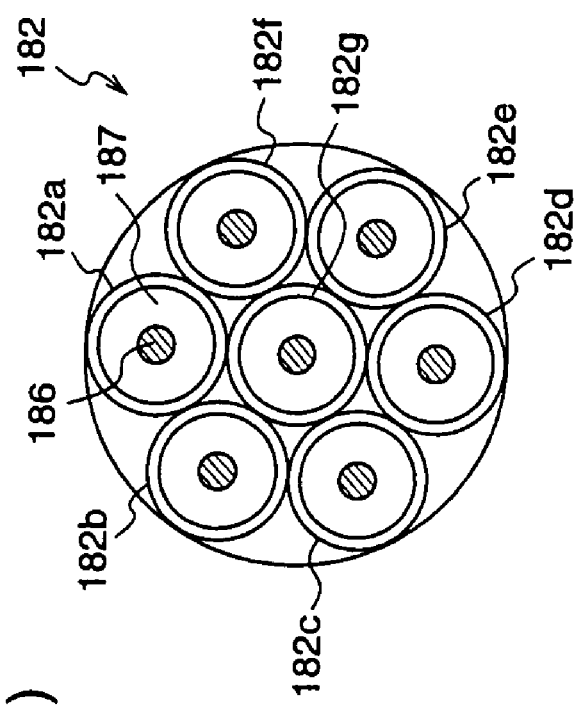
Fig.18(a)
Fig.18(b)

LASER LIGHT SOURCE AND OPTICAL DEVICE

The present application is based on International Application PCT/JP2006/307465, filed Apr. 7, 2006, which claims priority to Japanese Patent Application No. 2005-110597, filed Apr. 7, 2005, the entire contents of which are hereby incorporated by reference.

TECHNICAL FIELD

The present invention relates to a laser light source using a wavelength conversion element and an optical device using the light source.

BACKGROUND ART

In recent years, a laser display apparatus using laser light sources of three colors, i.e., red, green, and blue (hereinafter referred to as "RGB lasers") has been proposed. Since the laser display apparatus employing the RGB lasers is capable of realizing monochromacy and a broad color representation range of laser, a color display of highly vivid is enabled.

To realize a large-screen display apparatus using RGB lasers, a laser light source of several watts is needed. As means for realizing such laser light source, a high output power Ar laser or Kr laser has been conventionally used. However, since energy conversion efficiencies of these gas lasers are quite low as about 0.1%, a large-scale apparatus construction including a cooling device is needed.

In order to solve this problem, light generation of short wavelength light using a solid laser has been examined.

For example, by carrying out wavelength conversion of light of 1.064 μm emitted from a solid laser such as YAG into a second harmonic by a wavelength conversion element, generation of high power green light is realized. Recently, generation of high output power green light using a Yb-doped fiber laser has been reported, and further, non-patent Document 1 reports that generation of green light of 60 W can be realized by, using a LBO crystal (nonlinear optical crystal: $LiB_3O_5$) as a wavelength conversion element, carrying out wavelength conversion of light of fundamental wave that is entered thereto by the wavelength conversion element.

Further, there have been proposed methods of using green light or blue light which is directly generated from a solid laser as a light source. For example, patent Document 1 suggests and discloses a method of generating red light and green light by exciting a laser medium doped with trivalent praseodymium ion ($Pr^3$) with a GaN system semiconductor laser, and applying the lights in a laser display apparatus.
Non-patent Document 1: Optics Letters vol. 30, No. 1, pp. 67-69 (2005)
Patent Document 1: Japanese Published Patent No. 2001-264662

DISCLOSURE OF THE INVENTION

Problems to be Solved by the Invention

However, in the above-described laser light source, it has been known that speckle noises are generated at the laser irradiation plane due to high coherence of the light source. These speckle noises are generated due to interference effect of light which is generated when the laser beam is scattered on the irradiation plane, and they cause drastic reduction in picture quality, being a major problem in a laser display apparatus.

For example, as shown in non-patent Document 1, when short wavelength light which is obtained by wavelength conversion of the light from a solid laser by a wavelength conversion element is used as a light source, since the conversion efficiency is drastically reduced when the coherence of the light source is deteriorated, low coherent light cannot be used in order to carry out highly efficient wavelength conversion, and as a result, speckle noises would increase.

On the other hand, when one which is capable of directly oscillating short wavelength light from a solid laser is used as shown in patent Document 1, since a laser light source with high coherence is realized to reduce noises due to output variation, speckle noises due to the interference would also increase even in patent Document 1.

The present invention is made to solve the above-described problems and has for its object to provide a small and high output power laser light source capable of reducing speckle noises, and a high image quality optical device employing the laser light source.

Measures to Solve the Problems

In order to solve the above described problems, a laser light source of the present invention comprises a pump light source comprising a semiconductor laser, a solid laser medium which is excited by the pump light source, and multi-mode means for changing at least either a longitudinal mode or a transverse mode of laser oscillation of the solid laser medium into a multi-mode.

Therefore, highly efficient monochromatic light generation and a reduction in coherence of the laser light source can be realized.

Further, according to the laser light source of the present invention, the solid laser medium is added with at least either $Pr^{3+}$, $Eu^{3+}$, $Sm^{3+}$, $Ce^{3+}$, $Tm^{3+}$, $Tb^{3+}$, or $Eu^{2+}$.

Therefore, highly efficient wavelength light can be obtained.

Further, according to the laser light source of the present invention, the multi-mode means is a band-pass filter.

Further, according to the laser light source of the present invention, the multi-mode means is a grating mirror.

Further, according to the laser light source of the present invention, the multi-mode means is an over-saturation absorber.

Therefore, a longitudinal mode of light outputted from the laser light source can be changed into a multi-mode, whereby generation of low-coherence wavelength light can be realized.

Further, according to the laser light source of the present invention, the multi-mode means is a material having thermal lens effect.

Therefore, a transverse mode of light outputted from the laser light source can be changed into a multi-mode, whereby generation of low-coherence wavelength light can be realized.

Further, according to the laser light source of the present invention, the solid laser medium is co-doped with Ho.

Therefore, a transverse mode of light outputted from the laser light source can be changed into a multi-mode, whereby generation of low-coherence wavelength light can be realized. Further, the excitation efficiency of the solid laser medium can be improved.

Further, according to the laser light source of the present invention, the solid laser medium comprises a ceramic material.

Therefore, the efficiency of the laser light source can be improved and the laser light source can be manufactured at low cost.

Further, the laser light source of the present invention further comprises a reflector having narrow-band reflection characteristics, wherein the reflector fixes the oscillation wavelength of the semiconductor laser to the wavelength thereof.

Further, according to the laser light source of the present invention, the grating mirror has reflection characteristics in two wavelength ranges, one reflection wavelength is in the oscillation wavelength range of the solid laser medium and the other reflection wavelength is in the oscillation wavelength of the semiconductor laser.

Therefore, wavelength light outputted from the laser light source can be further stabilized.

Further, according to the laser light source of the present invention, the solid laser medium comprises a fiber having a double-clad structure, and the core of the fiber is add with at least either $Pr^{3+}$, $Eu^{3+}$, $Sm^{3+}$, $Ce^{3+}$, $Tm^{3+}$, $Tb^{3+}$, or $Eu^{2+}$.

Therefore, a small and high power laser light source which generates highly efficient wavelength light can be provided.

Further, according to the laser light source of the present invention, the multi-mode means is a grating fiber.

Therefore, a longitudinal mode of light outputted from the laser light source can be changed into a multi-mode, whereby generation of low-coherence wavelength light can be realized.

Further, according to the laser light source of the present invention, the grating fiber has reflection characteristics in two wavelength ranges, one reflection wavelength is in the oscillation wavelength range of the fiber as the solid laser medium and the other reflection wavelength is in the oscillation wavelength of the semiconductor laser.

Therefore, wavelength light outputted from the laser light source can be further stabilized.

Further, according to the laser light source of the present invention, the solid laser medium comprises an optical waveguide.

Further, the laser light source of the present invention comprises a seed light source comprising the pump light source, the solid laser medium, and the multi-mode means and a fiber which is excited by the pump light source, wherein seed light outputted from the seed light source is amplified by the fiber.

Therefore, generation of highly efficient wavelength light and a reduction in coherence of the laser light source can be realized.

Further, according to the laser light source of the present invention, the oscillation wavelength of the solid laser medium is red light of 600-660 nm.

Therefore, a small, high power, and low coherent red light source can be provided.

Further, according to the laser light source of the present invention, the oscillation wavelength of the solid laser medium is green light of 515-555 nm.

Therefore, a small, high power, and low coherent green light source can be provided.

Further, according to the laser light source of the present invention, the solid laser medium simultaneously generates any of red light of an oscillation wavelength of 600-660 nm, green light of an oscillation wavelength of 515-555 nm, and blue light of an oscillation wavelength of 440 nm.

Therefore, a small laser light source which simultaneously outputs RGB lights can be provided.

Further, according to the laser light source of the present invention, the pump light source is a GaN system solid light source.

Further, according to the laser light source of the present invention, high frequencies are superposed on output light of the semiconductor laser.

Therefore, a small, high power, and low coherent laser light source which can simultaneously output RGB lights whose modes are changed into multi-modes can be provided.

Further, according to the laser light source of the present invention, the fiber has a plurality of cores.

Therefore, since oscillation of different wavelengths at respective cores is enabled, a high power and highly efficient low coherent light source can be provided.

Further, according to the laser light source of the present invention, either the diameters of the plurality of cores or distances between the cores are different from each other.

Further, according to the laser light source of the present invention, either of the plurality of cores has a reflectance different from the other cores.

Therefore, the broadening of spectrum of the output light can be freely controlled.

Further, according to the laser light source of the present invention, either of the plurality of cores includes an additive different from the other cores or has an amount of additive different from the other cores.

Therefore, it is enabled to generate different wavelengths from the plurality of cores, whereby a plurality of high power wavelength lights can be generated by a simple construction.

Further, according to the laser light source of the present invention, either of the plurality of cores comprises a grating having a reflection wavelength different from the other cores.

Therefore, reflections of different wavelengths can be excited at respective cores.

Further, according to the laser light source of the present invention, either of the plurality of cores oscillates at a wavelength different from the other cores.

Therefore, different wavelength lights can be generated from the plurality of cores.

Further, the laser light source of the present invention further comprises a switch for switching generated wavelength lights from the fiber.

Therefore, a plurality of wavelength lights generated from the fiber can be outputted while being switched.

Further, the laser light source of the present invention further comprises a tapered fiber for widening the core diameter of the fiber in the vicinity of the output portion of the fiber.

Therefore, it can be made such that fouling does not adhere to the output end face of the fiber.

Further, the laser light source of the present invention further comprises at least one seed light source, wherein seed light outputted from the seed light source is amplified by the fiber.

Therefore, a plurality of wavelength lights generated from the fiber can be outputted while being switched.

Further, according to the laser light source of the present invention, the solid laser medium comprises a plurality of fibers having the double-clad structure.

Therefore, it is enabled to realize output light from the fiber to be increased in its output, efficiency, and wavelength thereof can be multiplied. Further, there is an effect that adjustment of the output wavelength can be carried out easily.

Further, according to the laser light source of the present invention, either of the plurality of fibers generates a wavelength different from the other fibers.

Therefore, since a plurality of wavelengths can be oscillated, a low coherent light source can be realized.

Further, the laser light source of the present invention comprises a plurality of pump light sources comprising a semiconductor laser for respectively exciting the plurality of fibers, wherein the plurality of fibers including non-doped fiber which is not added with $Pr^{3+}$, a plurality of wavelengths including output light of the pump light source which is outputted from the non-doped fiber and a plurality of wavelength lights which are output lights from the plurality of pump light sources being modulated independently by the plurality of fiber are outputted from the plurality of fibers.

Therefore, a light source which can simultaneously output RGB lights can be provided.

Further, according to the laser light source of the present invention, either of the plurality of fibers generates a plurality of wavelength lights.

Further, according to the laser light source of the present invention, either of the plurality of fibers has a plurality of cores.

Therefore, miniaturization of a light source which can simultaneously output RGB lights can be realized.

Further, the laser light source of the present invention further comprises a heat sink for cooling the plurality of fibers, wherein at least a part of the fiber is in contact with the heat sink.

Therefore, radiation of the fiber is facilitated, whereby oscillation efficiency of the laser can be drastically improved.

An optical device of the present invention comprises a red laser light source for generating red coherent light, a green laser light source for generating green coherent light, a blue laser light source for generating blue coherent light, and an optical system for irradiating the laser beam onto a screen or an irradiation body, wherein at least one of the red laser light source, the green laser light source, and the blue laser light source is the laser light source defined in any of claims 1 to 35.

Therefore, an optical device which can realize a high-quality image with reduced speckle noises can be provided.

Further, an optical device of the present invention comprises the laser light source defined in claim 21 or claim 30, an image converter element for converting a plurality of wavelength lights outputted from the laser light source into an image to be displayed on a display and a control circuit for detecting the output strengths of the plurality of wavelength lights which are generated from the laser light source, and controlling the respective strengths and the output ratios of the plurality of wavelength lights outputted from the image converter element in accordance with the output strengths.

Therefore, a small and highly efficient optical device having broad color reproducibility can be provided. Further, since it is possible to reduce speckle noises, high image quality video can be displayed.

Further, according to the optical device of the present invention, a fiber for transmitting light from the laser light source to the display includes scatterers for scattering light that wave-guides the fiber in its clad, and the image converter element is irradiated by side scattering from the fiber.

Therefore, a super-thin type optical device can be provided.

Effects of the Invention

According to the laser light source of the present invention, the laser light source comprises a laser medium, a pump light source comprising a semiconductor laser, and a multi-mode means for changing at least either a longitudinal mode or a transverse mode of laser oscillation from the laser medium into a multi-mode. Therefore, highly-efficient monochrome light generation and a reduction in coherence of the laser light source can be realized. Further, by applying this laser light source into an optical device, a small, high output power, and high image quality optical device with no speckle noises can be realized.

Further, by using a laser medium which is doped with a doping material such as Pr3+, a plurality of laser beams such as red, green, and blue in accordance with the doping material can be generated.

Furthermore, according to the laser light source of the present invention, a grating fiber is fusion bonded to a fiber having a double-clad structure so as to change outputted light from the fiber into light with multi-mode. Therefore, highly-efficient monochromatic light generation and a reduction incoherence of the laser light source can be realized. Further, if a plurality of cores is formed on the single fiber and the core diameters, the core shapes, and distances among the cores are varied, an improvement in output power and efficiency of laser beam outputted therefrom can be realized. Further, by changing a doping material to be added to the plurality of cores or additive amount thereof, laser beams of a plurality of colors can be outputted from the single fiber. Furthermore, by applying the light source into an optical device, a further miniaturized, high output power, and high picture quality optical device with no speckle noises can be realized.

BRIEF DESCRIPTION OF DRAWINGS

FIG. 1 is a diagram illustrating a construction of a laser light source according to a first embodiment of the present invention.

FIG. 2 . . .

FIG. 3 . . . FIG. 3 is a diagram illustrating another construction of the laser light source according to the first embodiment of the present invention.

FIG. 4 is a diagram illustrating yet another construction of the laser light source according to the first embodiment.

FIG. 5 is a diagram illustrating a construction of a laser light source for changing a transverse mode into a multi-mode in the first embodiment.

FIG. 6 is a diagram illustrating another construction of a laser light source for changing a transverse mode into a multi-mode in the first embodiment.

FIG. 7 is a diagram illustrating a construction of a laser light source in the first embodiment which comprises a reflector having narrow-band reflection characteristics in addition to broadband reflection characteristics.

FIG. 8 is a diagram illustrating fluorescent spectra of ceramic YAG as a base material when doped with Pr and when co-doped with Pr and Ho (holmium).

FIG. 9 is a diagram for illustrating a construction of a laser light source according to a second embodiment of the present invention.

FIG. 10 is a diagram illustrating another construction of the laser light source according to the second embodiment.

FIG. 11 is a diagram illustrating yet another construction of the laser light source according to the second embodiment.

FIG. 12 . . . FIG. 12 is a diagram illustrating a laser light source employing a fiber having plural cores.

FIG. 13 is a diagram illustrating a construction of a laser light source according to a forth embodiment of the present invention.

FIG. 14 . . . FIG. 14 is a diagram illustrating a construction of a laser light source using a fiber having plural cores for outputting light of plural wavelengths according to a fifth embodiment, and FIG. 14(a) is a cross-sectional view of the laser light source and FIG. 14(b) is a cross-sectional view of the fiber.

FIG. 15 . . . FIG. 15 is a diagram illustrating a construction of a laser light source for outputting irradiation light from a single fiber by switching the light according to the fifth embodiment.

FIG. 16 . . . FIG. 16 is a diagram illustrating another construction of the laser light source for outputting irradiation light from a single fiber by switching the light according to the fifth embodiment.

FIG. 17 is a diagram illustrating yet another construction of the laser light source for outputting irradiation light from a single fiber by switching the light according to the fifth embodiment.

FIG. 18 . . . FIG. 18 is a diagram illustrating a construction of a laser light source comprising a plurality of fiber bundles according to a sixth embodiment, and FIG. 18(a) is a diagram illustrating the construction and FIG. 18(b) is a cross-sectional view of the fiber.

FIG. 19 . . . FIG. 19 is a diagram illustrating another construction of a laser light source comprising a plurality of fiber bundles according to the sixth embodiment.

FIG. 20 is a diagram illustrating a construction of a laser display according to a seventh embodiment.

FIG. 22 . . . FIG. 22 is a diagram illustrating a construction of a liquid crystal display according to the seventh embodiment.

FIG. 23 is a diagram illustrating another construction of the liquid crystal display according to the seventh embodiment.

Figure 1:
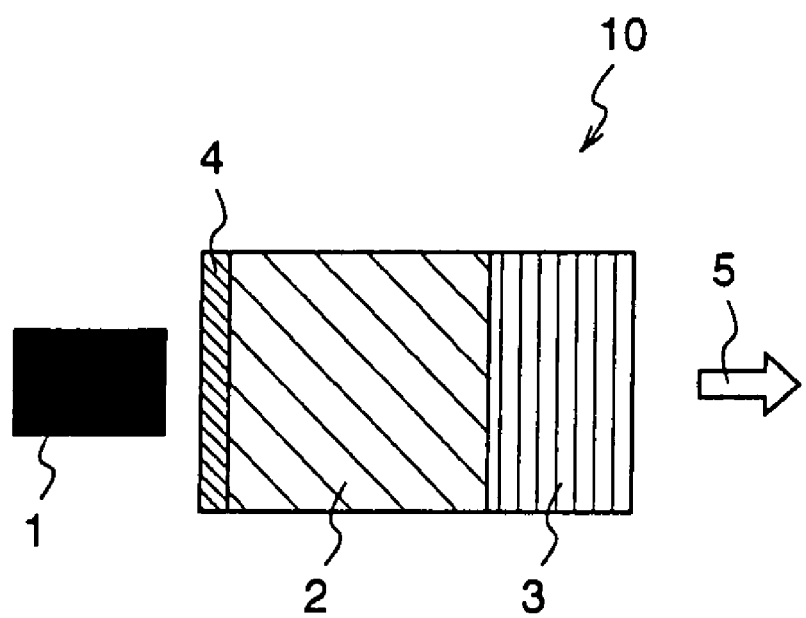
FIG. 1 . . .

DESCRIPTION OF REFERENCE NUMERALS 1, 191 . . . GaN system semiconductor laser
2, 92 . . . laser medium
3, 63, 103 . . . reflector
4, 21, 51, 74, 104, 133 . . . multilayer mirror
5, 65, 75, 85,95, 105, 115, 125, 135, 145, 155, 195 . . . output light
6 . . . returned light
10, 20, 30, 40, 50, 60, 70, 80, 90, 100, 110, 120, 130, 140, 150, 180, 190, 1101, 1201, 1301, 1401 . . . laser light source
11 . . . excited spot
22 . . . external grating
22a . . . volume grating
22b . . . grating
31 . . . over-saturation absorber
41 . . . heat sink
42 . . . hole
72, 82, 112, 122, 142, 152, 182, 192 . . . doped fiber
73, 76, 129, 149 . . . grating fiber
81 . . . seed light source
85 . . . coupler
91 . . . incident portion
93, 113, 123, 143 . . . grating
94 . . . output portion
96 . . . substrate
97 . . . gap portion
98 . . . ridge wave-guide path
116, 126, 186, 196 . . . core
117, 127 . . . clad
136 . . . wavelength selection filter
137 . . . driving device
138 . . . condenser optical system
146 . . . switch
151a . . . red laser
151b . . . green laser
1100, 1200 . . . laser display apparatus
1102 . . . collimator optical system
1103 . . . integrator optical system
1105, 1303 . . . liquid crystal panel
1106, 1205 . . . screen
1107 . . . projection lens
1202, 1205 . . . screen
1107 . . . projection lens
1202, 1203 . . . mirror
1204 . . . laser beam
1206 . . . color filter
1207 . . . modulator
1300, 1400 . . . liquid crystal display apparatus
1302, 1402 . . . fiber
1304 . . . control circuit
1305, 1405 . . . display

THE BEST MODE TO EXECUTE THE INVENTION

Hereinafter, a description will be given of a construction using a solid laser medium capable of directly oscillating short wavelength light to realize a low coherence laser beam which is needed for a display device.

(First Embodiment)

FIG. 1 is a diagram illustrating a construction of a laser light source according to this first embodiment. Reference numeral 1 denotes a gallium nitride (GaN) semiconductor laser, reference numeral 2 denotes a laser medium which is doped with trivalent praseodymium ion ($Pr^3$), reference numeral 3 denotes a reflector, reference numeral 4 denotes a multilayer mirror, reference numeral 10 denotes a laser light source, and reference numeral 5 denotes output light from the laser light source.

The GaN laser 1 is a wide-stripe semiconductor laser, and has an oscillation wavelength in the vicinity of 440 nm, and output power thereof ranges from 500 mW to few watts. The multilayer mirror 4 transmits a wavelength of 440 nm and reflects a wavelength in the vicinity of 530 nm. The reflector 3 is a grating mirror having a narrow-band reflection characteristic in the vicinity of 530 nm. The laser medium 2 has an absorption characteristic in the vicinity of 440 nm and an oscillation characteristic in the vicinity of 530 nm, and constitutes a resonator together with the multilayer mirror 4 and the reflector 3.

Hereinafter, operations of the laser light source will be described. First, light of a wavelength in the vicinity of 440 nm which has been outputted from the GaN laser 1 is transmitted through the multilayer mirror 4, and excites the laser medium 2. The oscillation wavelength of the laser medium 2 excited by the GaN laser 1 is outputted to the outside through the reflector 3, thus the oscillation wavelength of the laser medium 2 is controlled by the reflection characteristic of the reflector 3.

Figure 2A:
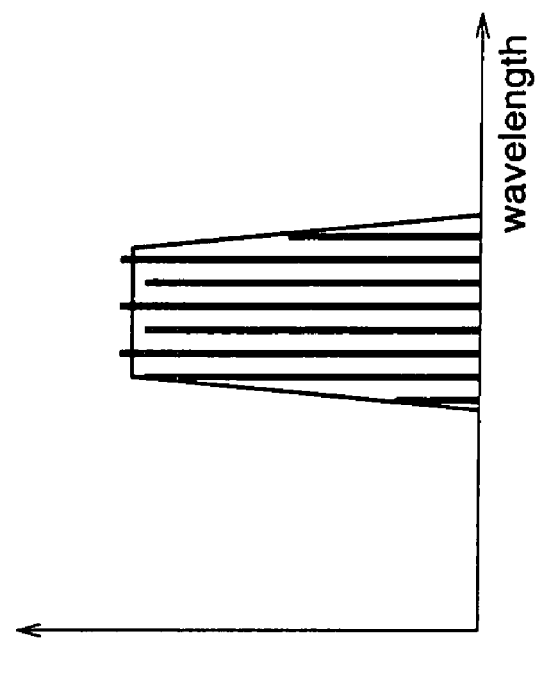
FIG. 2(a) is a diagram illustrating reflection characteristics of a reflector in the laser light source 1 according to the first embodiment of the present invention.
Figure 2B:
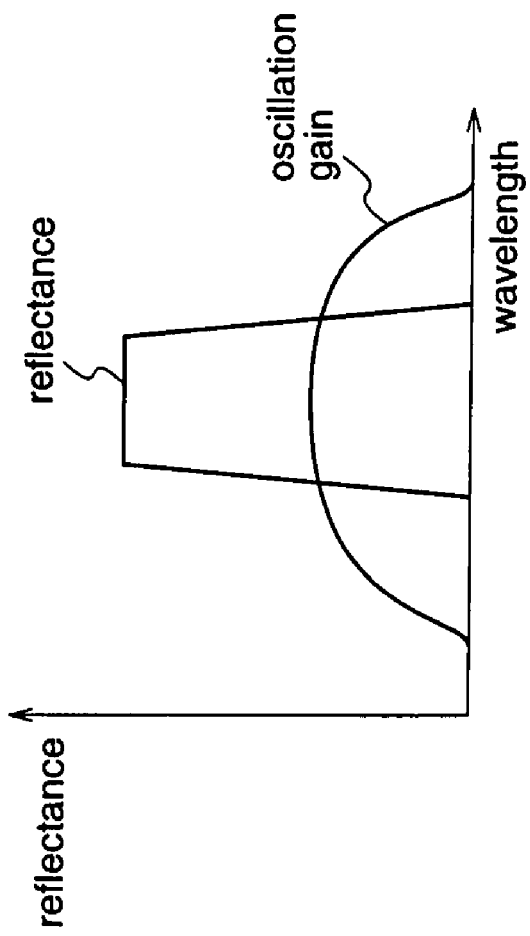
FIG. 2(b) is a diagram illustrating an oscillation wavelength from a laser medium in the laser light source 1 according to the first embodiment of the present invention.

FIG. 2(a) is a diagram illustrating the reflection characteristic of the reflector of the laser light source according to this first embodiment, and FIG. 2(b) is a diagram illustrating the oscillation wavelength from the laser medium according to this first embodiment.

For example, if one having a broad reflection characteristic in a wavelength range (in the vicinity of 530 nm herein) where the oscillation gain of the laser medium 2 exists is used as the reflector 3, as shown in FIG. 2(a), the oscillation wavelength of the laser medium 2 will generate a plurality of oscillation spectra within the reflection band of the reflector 3 as shown in FIG. 2(b), and as a result, a longitudinal mode of the oscillation wavelength of the laser medium 2 can be changed into a multi-mode, and reduction in coherence is enabled.

Then, light which is obtained by changing the longitudinal mode of the oscillation wavelength of the laser medium 2 into a multi-mode as described above is outputted as output light 5.

Meanwhile, since the laser light source 10 according to this first embodiment uses direct oscillation utilizing the laser medium 2 excited by the GaN laser 1, very high conversion efficiency ranging from 20 to 30% can be realized even if the coherence is reduced due to changing of the longitudinal mode into a multi-mode. For example, in the case of this first embodiment, a green light source of 100 mW to 150 mW was realized by excitation of 500 mW by the GaN laser 1.

As described above, the laser light source according to the first embodiment comprises the GaN laser 1 having a oscillation wavelength in the vicinity of 440 nm, the laser medium 2 which is doped with trivalent praseodymium ion ($Pr^{3+}$), and the reflector 3 having a narrow-band reflection characteristic in the vicinity of 530 nm, wherein the laser medium 3 is excited by the GaN laser 1, and the oscillation wavelength of the laser material 2 is controlled by the reflection characteristic of the reflector 3 so as to carry out changing mode. Accordingly, realization of a small, high power output, and low coherent green light source is enabled.

As another construction of the above-described laser light source, an external grating which is separated from the laser medium 2 may be provided as multi-mode means for changing a longitudinal mode of the oscillation wavelength of the laser medium 2 into a multi-mode, as shown in FIG. 3, so as to carry out light feedback to the laser medium 2 from the outside and a longitudinal mode of the oscillation wavelength of the laser medium 2 can be changed into a multi-mode.

Figure 3A:
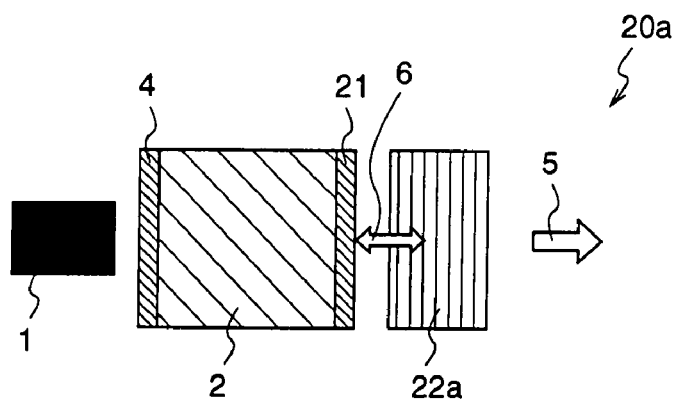
FIG. 3(a) is a diagram illustrating the laser light source when using a volume grating as a grating.

Hereinafter, description will be given in detail. FIGS. 3(a), (b) are diagrams illustrating another construction of the laser light source according to this first embodiment. Reference numeral 1 denotes a GaN semiconductor laser, reference numeral 4 denotes a multilayer mirror, reference numeral 21 denotes a second multilayer mirror, reference numerals 22a, 22b denote external gratings, reference numeral 6 denotes returned light, reference numerals 20a, 20b denote laser light sources, and reference numeral 5 denotes output light from the laser light source.

The second multilayer mirror 21 reflects light of a wavelength in the vicinity of 530 nm. The laser medium 2 constitutes a resonator with the multilayer mirror 4 which transmits light of a wavelength of 440 nm and reflects light of a wavelength of 530 nm and the second multilayer mirror 21.

Figure 3B:
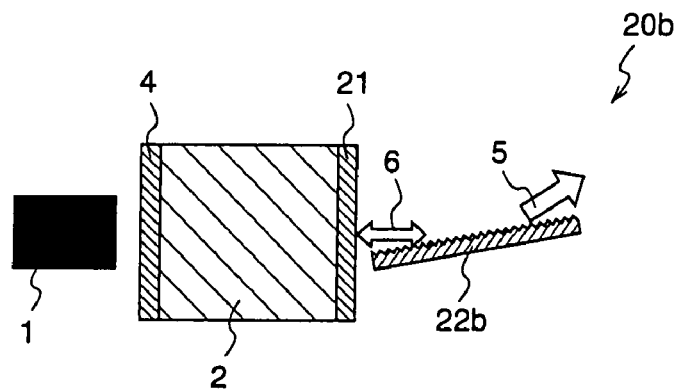
FIG. 3(b) is a diagram illustrating the laser light source when using a grating.

As shown in FIG. 2(a), the external gratings 22a, 22b have a narrow-band reflection characteristic in the vicinity of 530 nm. FIG. 3(a) illustrates an example where a volume grating 22a is used, and FIG. 3(b) illustrates an example where the grating 22b is used.

Hereinafter, the operation will be described. First, light of a wavelength in the vicinity of 440 nm which has been outputted from the GaN laser 1 is transmitted through the multilayer mirror 4, and excites the laser medium 2. The laser medium 2 excited by the GaN laser 1 resonates light of a wavelength in the vicinity of 530 nm by the multilayer mirrors 4, 21, and oscillates a laser beam in the vicinity of 530 nm. The light which has been outputted from the laser medium 2 is entered into the external gratings 22a, 22b. At this time, a part of the light which has been outputted from the laser medium 2 is reflected by the external gratings 22, and is returned to the laser medium 2 as the returned light 6, and thereby the oscillation wavelength of the laser medium 2 is controlled.

In this first embodiment, ones having a broad reflection characteristic in a wavelength range (in the vicinity of 530 nm herein) where the oscillation gain of the laser medium 2 exists as shown in FIG. 2(a) are used as the external gratings 22a, 22b. Thereby, the oscillation wavelength of the laser medium 2 will generate a plurality of oscillation spectra in the reflection band of the external grating 22b as shown in FIG. 2(b), and as a result, the longitudinal mode of the wavelength of the laser medium 2 can be changed into a multi-mode whereby reduction in coherence is enabled.

In this way, low coherent light which is obtained by changing a longitudinal mode of the oscillation wavelength of the laser medium 2 into a multi-mode is outputted as the output light 5 of the laser light sources 20a, 20b.

Meanwhile, since the laser light sources 20a, 20b shown in FIG. 3 use direct oscillation by the laser medium which is excited by the GaN laser as similarly to the laser light source shown in FIG. 1, very high conversion efficiency ranging from 20 to 30% can be realized even if the coherence is reduced due to the changing of a longitudinal mode into a multi-mode, and as a result, a small, high power, and low coherent green light source can be realized.

Here, the coherence of the output light 5 can be further reduced by broadening the reflection band of the external grating 22. As ways to increase the bands of reflection wavelengths of the external gratings 22a, 22b, there are ways such as shortening the interaction length between the external gratings 22a, 22b, disturbing periodicity thereof, and using periods of chirp structures.

Figure 4:
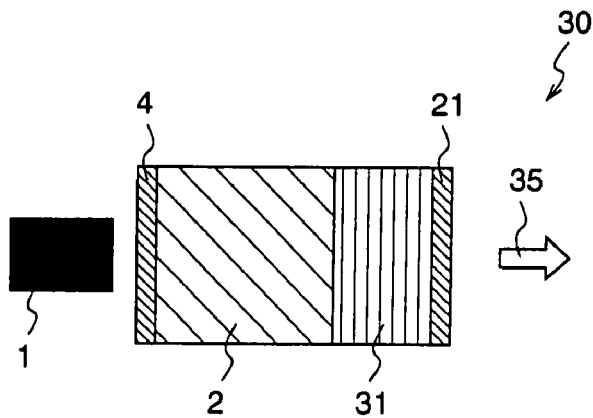
FIG. 4 . . .

As yet another construction of the above described laser light source, an over-saturation absorber 31 may be inserted in the laser medium 2 as multi-mode means for changing the longitudinal mode of the oscillation wavelength of the laser medium 2 into a multi-mode, as shown in FIG. 4. Even with such construction, the changing of longitudinal mode of oscillation wavelength of the laser medium 2 into a multi-mode is enabled.

Hereinafter, description will be given in detail. FIG. 4 is a diagram illustrating yet another construction of the laser light source according to this first embodiment. Reference numeral 1 denotes a GaN semiconductor laser, reference numeral 2 denotes a laser medium, reference numerals 4, 21 denote multilayer mirrors, reference numeral 31 denotes an over-saturation absorber, reference numeral 30 denotes a laser light source, and reference numeral 35 denotes output light from the laser light source.

As described above, the laser medium 2 constitutes a resonator with the multilayer mirror 4 which transmits light of a wavelength of 440 nm and reflects light of a wavelength in the vicinity of 530 nm and the multilayer mirror 21 which reflects light of a wavelength in the vicinity of 530 nm. The over-saturation absorber 31 has absorption coefficient which is changed nonlinearly corresponding to incident light intensity. By inserting the over-saturation absorber 31 in the resonator, the laser medium 2 carries out narrow-band pulse oscillation, and by this pulse oscillation, the longitudinal mode of wavelength oscillation of the laser medium 2 can be changed into a multi-mode. Consequently, reduction in coherence is enabled.

Further, if the over-saturation absorber 31 is inserted in the resonator, the reflectance of the over-saturation absorber 31 changes temporally. As a result, the optical length of the resonator changes temporally, and thereby the oscillation spectrum of the resonator can be changed into a multi-mode.

Furthermore, if a thermal lens is generated by the over-saturation absorber 31 when the over-saturation absorber is inserted in the resonator as the multi-mode means, an oscillation transverse mode within the resonator is disrupted, and thereby the transverse mode of oscillation wavelength of the laser medium 2 can be also changed into a multi-mode. Here, a thermal lens refers to a reflectance variation which is formed due to heat distribution in the solid laser, and this reflectance variation optically functions as equivalent to a convex lens.

As described above, reduction in speckle noises is enabled by changing the transverse mode of an oscillation wavelength into a multi-mode. One of the reasons is that the spectra are dispersed when the transverse mode is changed into a multi-mode. Since respective transverse modes have different spectra, speckle noises are reduced when the interference is reduced by the mode of oscillation wavelength of the laser medium 2 being changed into a multi-mode. Further, another reason is that speckle patterns differ when transverse modes are different. When a plurality of speckle patterns are formed by a plurality of transverse modes, the plurality of speckle patterns overlap with one another, and are averaged. And accordingly, the speckle noises are reduced.

Controlling heat emission of the laser medium 2 is also effective as multi-mode means for changing a transverse mode into a multi-mode.

Trivalent praseodymium ion ($Pr^{3+}$) has a minimal absorption in the vicinity of 530 nm. Therefore, if heat emission of the laser medium 2 is slightly blocked, a temperature distribution is formed in the laser medium 2 by the absorption due to the laser oscillation, and thereby a thermal lens effect is generated. Therefore, the changing of the transverse mode into a multi-mode is enabled.

Further, a temperature distribution is formed in the laser medium 2 due to absorption of excitation light from the GaN laser 1, whereby a thermal lens effect is generated and the changing of a transverse mode into a multi-mode is enabled.

Furthermore, if uniformity of heat emission of the laser medium 2 is made to be asymmetrical and the heat emission of the laser medium is made to have a distribution, the heat distribution in the laser medium 2 is emphasized and thereby the changing of a transverse mode into a multi-mode can be facilitated.

Hereinafter, a few examples of specific ways to realize the changing of a transverse mode into a multi-mode as described above will be given.

Figure 5A:
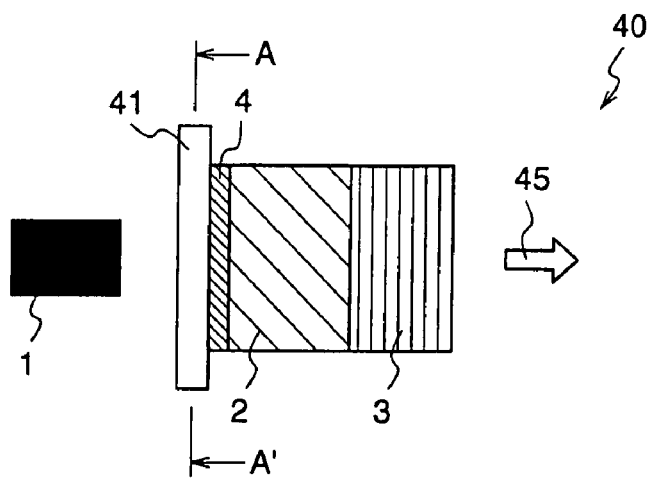
FIG. 5 . . .
Figure 5B:
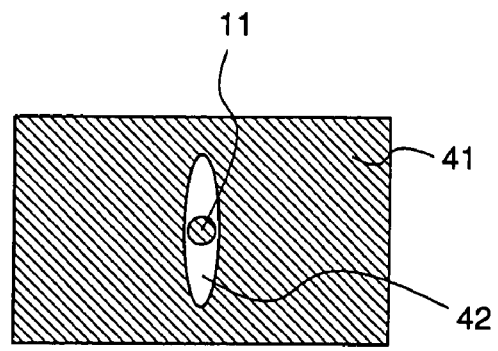

A first way is to make the shape of a heat sink for cooling the laser medium 2 to have an asymmetric structure with relative to an excitation spot of the GaN laser in order to make the reflectance distribution to be asymmetric structured from center symmetric structured. FIG. 5(*a*) is a diagram illustrating a construction of a laser light source comprising a heat sink for cooling a laser medium whose shape is made to have an asymmetric structure, and FIG. 5(*b*) is a diagram illustrating an A-A' cross-section view of the construction. In FIG. 5, reference numeral 41 denotes a heat sink for cooling the laser medium 2, reference numeral 42 denotes a hole opened on the heat sink 41, reference numeral 11 denotes an excitation spot of the GaN laser, reference numeral 40 denotes a laser light source, and reference numeral 45 denotes output light from the laser light source. As shown in FIG. 5, when the laser light source 40 has a construction to excite the laser medium 2 by the excitation spot 11 of the GaN laser 1 through the hole 42 on the heat sink 41, the shape of the hole 42 is made to be asymmetric structured. Thereby, a thermal lens effect is generated due to the heat distribution in the laser medium 2 becoming asymmetric, whereby the transverse mode is changed into a multi-mode.

Further, a second way is to use a ceramic material as the laser medium 2 in order to make the excitation itself of the laser medium 2 to be asymmetrical distribution. If a ceramic material is used as the laser medium 2 in this way, additive distribution of $Pr^{3+}$ ion or the like in the laser medium 2 can be freely controlled, and thereby the transverse mode can be changed into a multi-mode while the excitation efficiency of the laser medium 2 is made to have distribution.

A third way is to insert a material such as an over-saturation absorber which changes reflectance thereof by slightly absorbing light in a resonator, as shown in FIG. 4. In this way, by reflectance distribution which is generated due to the inserted material absorbing light within the resonator, the transverse mode can be changed into a multi-mode.

Figure 6:
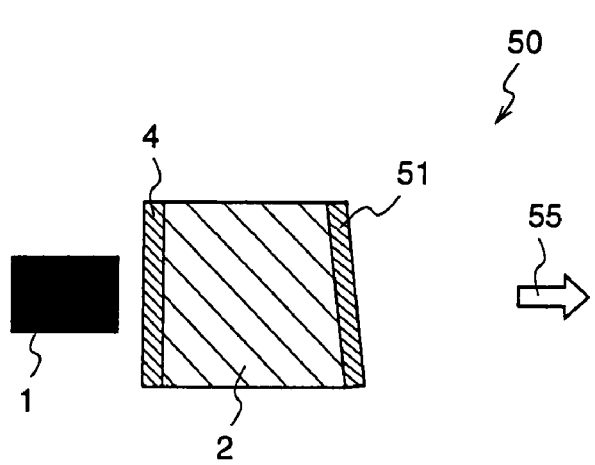
FIG. 6 . . .

A fourth way is to make the resonator to have an asymmetric structure. FIG. 6 is a diagram illustrating a construction of a laser light source in which the resonator has an asymmetric structure. Reference numeral 1 denotes a GaN laser, reference numeral 2 denotes a laser medium, reference numerals 4, 51 denote multilayer mirrors, reference numeral 50 denotes a laser light source, and reference numeral 55 denotes output light from the laser light source. Here, though the resonator is constituted by the multilayer mirrors 4, 51, the resonator is made to have an asymmetrical structure by slightly tilting the second multilayer mirror 51 as shown in FIG. 6, to change a transverse mode of the output light 55 into a multi-mode. Meanwhile, though resonator loss is increased when the second multilayer mirror 51 is tilted, the resonator loss can be drastically reduced when the laser medium 2 has lens action due to a thermal lens effect. Though a case where the multilayer mirror is a flat mirror is given as an example herein, if the multilayer mirror is a concave mirror, resonator loss is hardly generated even if the multilayer mirror is tilted, and thereby it is effective. Further, it is possible to combine and use the above described first to fourth ways in order to change a transverse mode into a multi-mode.

Further, a transverse mode can be changed into a multi-mode by deviating the length of the resonator in the light source and the curvature of the multilayer mirror from the design for a single mode.

By using a few of these multi-mode means for changing a transverse mode into a multi-mode and the above described multi-mode means for changing a longitudinal mode into a multi-mode simultaneously, coherence of a laser beam can be reduced and speckle noises can be drastically reduced at display application. Meanwhile, in order to obtain a reduction effect in speckle noises in a laser display, it is necessary to broaden the spectrum width by at least more than 2 nm, and preferably by more than 5 nm.

Further, as shown in FIG. 2(*a*), though a case where the reflection characteristic of the reflector 3 as multi-mode means is single reflection and flat is taken as an example in the first embodiment, the same effect can be achieved when the reflection characteristic is separated into a plurality of spectra.

Figure 7:
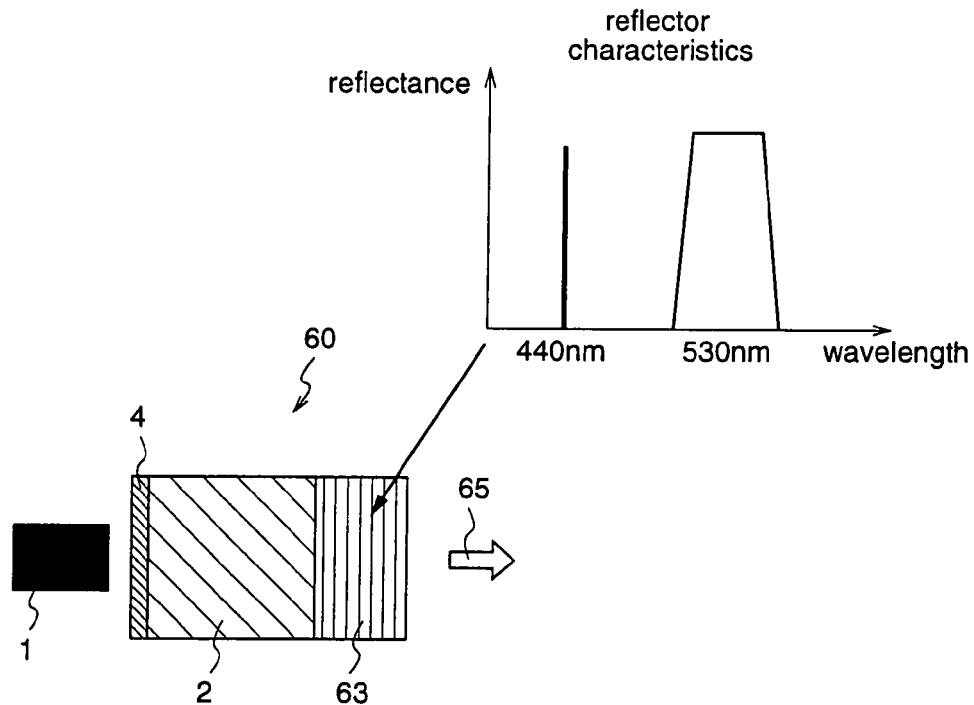
FIG. 7 . . .

Further, as shown in FIG. 7, if the over-saturation absorber 63, such as a volume grating, of the laser light source 60 is made to have a narrow-band reflection characteristic in the vicinity of 440 nm in addition to a broad reflection characteristic in the vicinity of 530 nm, output of the output light 65 can be further stabilized.

Hereinafter, the reasons will be given. Though $Pr^{3+}$ which is doped to the laser medium 2 has a large absorption in the vicinity of 440 nm, a wavelength band that $Pr^{3+}$ absorbs is narrow. Therefore, when the wavelength of an excitation light source is changed due to factors such as external temperature, the absorption efficiency of $Pr^{3+}$ is largely changed whereby output of the output light 65 becomes unstable. In order to prevent this, it is necessary to stabilize the wavelength of the GaN laser 1 as a pump light source. Consequently, by providing a volume grating 63 having a narrow-band reflection characteristic in the vicinity of 440 nm, and using the brag reflection thereof to return light in the vicinity of 440 nm to the GaN laser 1 as an excitation light source, it is enabled to fix the oscillation wavelength of the GaN laser 1 to the peak position of the absorption wavelength of the volume grating 63, and thereby output of the output light 65 can be further stabilized.

Meanwhile, since the volume grating 63 also has a broad reflection characteristic in the vicinity of 530 nm, it is enabled to oscillate the laser medium 2 in the vicinity of 530 nm, and at the same time, to change a longitudinal mode into a multi-mode.

By the way, though the laser medium 2 which is doped with $Pr^{3+}$ used in this first embodiment has different oscillation wavelengths depending on what the medium is, it has oscillation wavelengths in wavelength bands of red light of 600-660 nm and green light of 515-555 nm. Therefore, by using this characteristic, laser display light sources for outputting RGB lights can be realized. Meanwhile, when color reproducibility of displays is considered, a wavelength band of 520-540 nm as green light and a wavelength band of 620-640 nm as red light are preferable as the oscillation wavelengths of the laser medium 2.

Further, the changing of a longitudinal mode into a multi-mode can be also facilitated by co-doping other material to the $Pr^{3+}$ doped laser medium 2.

Figure 8:
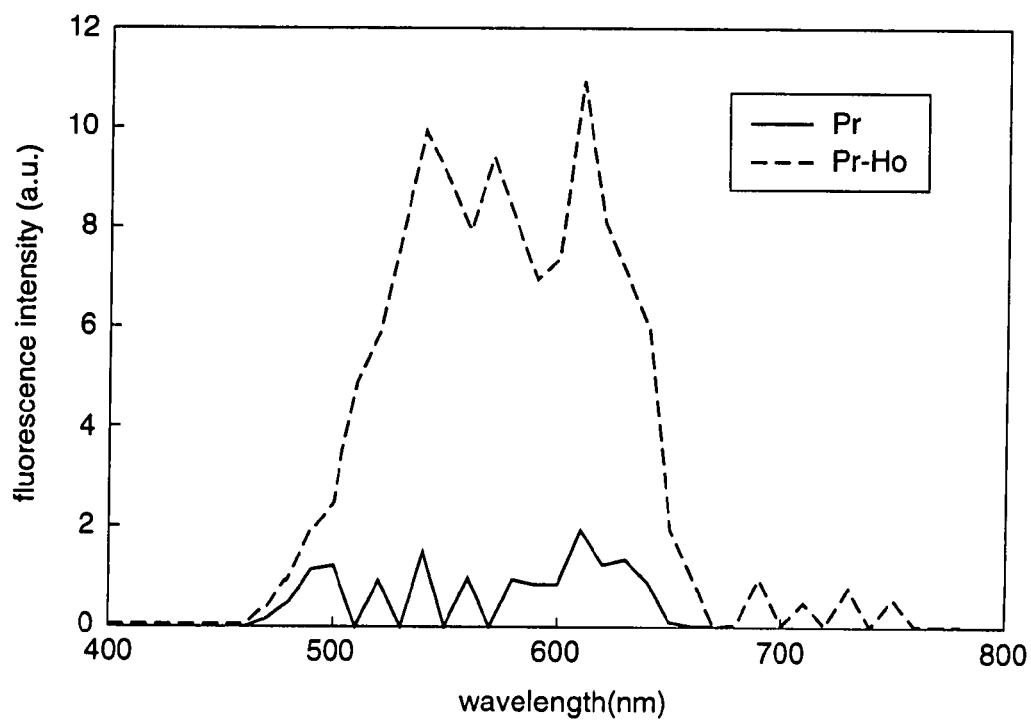
FIG. 8 . . .

FIG. 8 is a diagram illustrating fluorescent spectra in cases where Pr is doped to and where Pr and Ho (holmium) are co-doped to ceramic YAG as a base material. As is clear from FIG. 8, the laser medium has strong fluorescent characteristic in a very broad range from in the vicinity of 500 nm to about 650 nm when Pr and Ho are co-doped thereto. Accordingly laser oscillation of a very broad wavelength band is enabled. Therefore, the efficiency of the oscillation spectrum can be increased and the band thereof can be broadened.

As described above, if the various multi-mode means as described above is provided for a laser light source, and Pr and Ho are co-doped to the laser medium 2, a small, high output power, and highly efficient low-coherent light source can be realized.

Meanwhile, ranges of about 1-3% as a dope amount of Pr and 1-3% as a dope amount of Ho are effective. Further, other than YAG, materials such as YLF (LiYF4), YVO4, glass, aluminum fluoride, and other fluoride are also effective as a base material. Further, though a material having a crystal structure is effective as a base material, a ceramic material is also effective. Since a ceramic material is capable of increasing a dope amount of Pr, Ho, or the like, and is easy to manufacture, it is effective for making a laser light source to be highly efficient and manufacturing the laser light source at low cost.

Further, other than Ho, if a material such as Yb (ytterbium), Nd (Neodymium), Er (erbium), or Cr (chrome) is co-doped together with Pr as a co-doping material, the absorption coefficient of the laser medium 2 can be increased, and thereby the excitation efficiency of the laser medium 2 is improved. Therefore, it is possible to make the light source to be more highly efficient.

Meanwhile, though a case where a volume grating or a grating is used as multi-mode means for changing a longitudinal mode into a multi-mode is taken as an example in this first embodiment, it is possible to use a narrow-band band pass filter other than the gratings. A band pass filter is a multilayer filter which transmits a certain wavelength. In this case, by inserting a band pass filter in the resonator to reduce the transmission loss of the certain wavelength, an oscillation wavelength of the solid laser can be selected. Then, if the transmission characteristic of the band pass filter is designed to transmit a plurality of longitudinal mode spectra, changing of a longitudinal mode into a multi-mode is enabled.

Furthermore, though description was given in this first embodiment by taking a case where the laser material 2 is doped with $Pr^{3+}$ as an example, a construction in which the laser material 2 is doped or co-doped with trivalent europium ion ($Eu^{3+}$), trivalent samarium ion ($Sm^{3+}$) trivalent cerium ion ($Ce^{3+}$), trivalent thulium ion ($Tm^{3+}$), trivalent terbium ion ($Tb^{3+}$), divalent europium ion ($Eu^{2+}$) or the like is also effective.

For example, when f-f absorption by pump light of a wavelength in the vicinity of 400 nm is used, red light in the vicinity of 615 nm can be obtained by a transition from 5d0 to 7f2 from a $Eu^{3+}$ doped laser medium. Further, oscillation in the similar red spectrum is possible if a $Sm^{3+}$ doped laser medium is used. Meanwhile, since the pump light of a wavelength in the vicinity of 400 nm as described above has an optimum amount of In (indium) in an InGaN (indium gallium nitride) semiconductor laser, there is an advantage that a highly reliable laser having a high power resistance can be used as a pump light source in the case of $Eu^{3+}$ doped laser medium.

Further, in the laser light source according to this first embodiment, problems such as deterioration in efficiency at high temperatures and deterioration in high power characteristic which have been occurred in red semiconductor lasers do not occur. Therefore, there can be provided a display light source having an extremely exceeding characteristic that wavelength variation due to temperature is small.

Further, generation of blue light in the vicinity of 450 nm is enabled if a laser medium doped with $Cs^{3+}$, $Eu^{2+}$, or $Tm^{3+}$ is used, and generation of green light in the vicinity of 543 is enabled if a laser medium doped with $Tb^{3+}$ is used.

Furthermore, by co-doping a plurality of these ions, it is enabled to control an oscillation wavelength and to generate a plurality of light at the same time. As a result, the changing of an oscillation wavelength spectrum into a multi-mode becomes stronger, and thereby reduction effect in speckle noises is increased. Further, there is an advantage that a displayable color range is widely broadened by a plurality of wavelengths. Furthermore, by co-doping a plurality of ions, there is an advantage that luminous efficiency can be improved due to energy transmissions among the ions.

Meanwhile, a GaN semiconductor laser as a pump light source is taken as an example herein, a GaN LED can be used other than a GaN semiconductor laser. Since an LED is affordable and has high efficiency, it is effective as a pump light source.

(Second Embodiment)

Figure 9A:
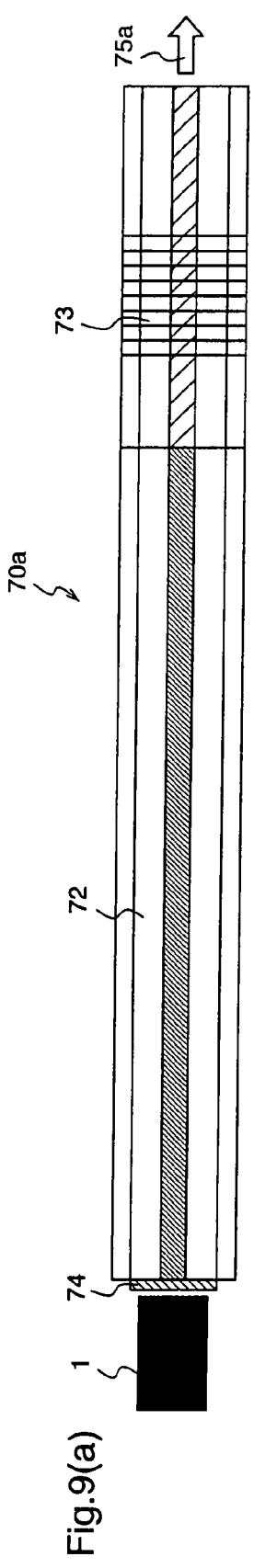
FIG. 9 . . .

In this second embodiment, description will be given of a laser light source using a doped fiber. FIG. 9(a) is a diagram illustrating a construction of a laser light source according to this second embodiment. Reference numeral 1 denotes a GaN semiconductor laser, reference numeral 72 denotes a double-clad fiber whose core is doped with $Pr^{3+}$, reference numeral 73 denotes a grating fiber, reference numeral 74 denotes a multilayer mirror, reference numeral 70a denotes a laser light source, and reference numeral 75a denotes output light from the laser light source.

The GaN laser 1 is a wide stripe semiconductor laser as similarly in the first embodiment, and has a wavelength in the vicinity of 440 nm, and output power thereof ranges from 500 mW to few watts. The multilayer mirror 74 transmits a wavelength of 440 nm and reflects a wavelength in the vicinity of 530 nm. As shown in FIG. 2(a), a grating having a narrow-band reflection characteristic whose wavelength range is broadened to in the vicinity of 530 nm is formed on the grating fiber 73. The doped fiber 72 has an absorption characteristic in the vicinity of 440 nm and an oscillation characteristic in the vicinity of 530 nm, and constitutes a resonator with the multilayer mirror 74 and the grating fiber 73.

Hereinafter, the operation will be described. First, light of a wavelength in the vicinity of 440 nm which has been outputted from the GaN laser 1 is transmitted through the multilayer mirror 74 and is introduced into the double-clad doped fiber 72. When the excitation light is absorbed by the $Pr^{3+}$ ions which are added to the core of the doped fiber, green light in the vicinity of 530 nm is generated. Though the light which has been oscillated in this doped fiber 72 is outputted to the outside through the grating fiber 73, the oscillation wavelength thereof is controlled by the reflection characteristic of the grating fiber 73. That is, by making a longitudinal mode of oscillation wavelength of the doped fiber 72 to be a multi-mode, light whose wavelength range is broadened can be outputted as the output light 75a as shown in FIG. 2(b), and as a result, reduction in speckle noises due to reduction in coherence is enabled.

Furthermore, if the core diameter of the doped fiber 72 is enlarged to more than 10 μm for example, a transverse mode of output light from the doped fiber 72 can be changed into a multi-mode. As described above, the changing of oscillation wavelength into a multi-mode can be facilitated by changing a transverse mode into a multi-mode, and it is effective for reduction in speckle noises due to reduction in coherence. Further, broadening a core diameter is effective for reducing the power density of oscillation light in the fiber, and as a result, physical damages such as the fiber being melted can be avoided.

Figure 9B:
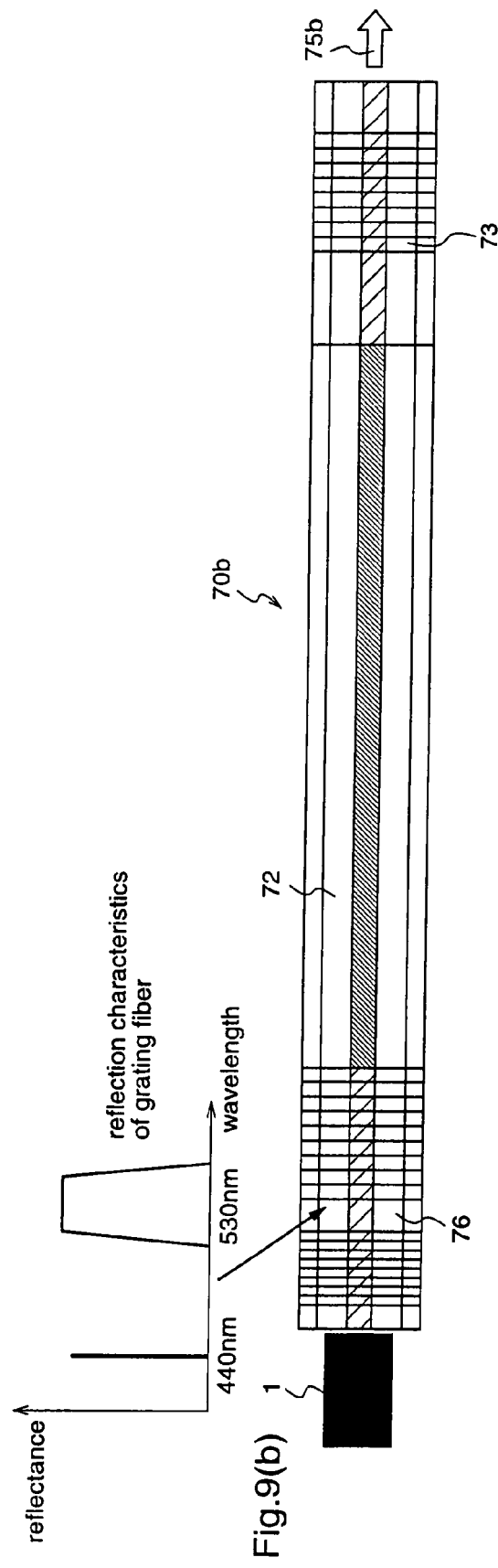

FIG. 9(b) is a diagram illustrating another construction of the light source according to this second embodiment. Here, as shown in FIG. 9(b), a grating fiber 76 on which a grating having a narrow-band reflection characteristic in the vicinity of 440 nm and a grating slightly having a broad band reflection characteristic in the vicinity of 530 nm are formed is used in the place of the multilayer mirror 74 which transmits a wavelength of 440 nm and reflects a wavelength in the vicinity of 530 nm. Other components are similar to those in the first embodiment.

$Pr^{3+}$ which is added to the core of the doped fiber 72 has large absorption in the vicinity of 440 nm, but a wavelength range that $Pr^{3+}$ absorbs is narrow. Therefore, when the wavelength of the excitation light source is changed due to factors such as outside temperature, the absorption efficiency of $Pr^{3+}$ is varied largely, whereby output of output light becomes unstable. In order to prevent this, it is necessary to stabilize the wavelength of the GaN laser 1 as a pump light source. Consequently, by utilizing brag reflection of the grating fiber 76 shown in FIG. 9(b) to return light in the vicinity of 440 nm to the GaN laser 1, the oscillation wavelength of the GaN laser will be fixed to the peak position of absorption wavelength of the doped fiber 72. On the other hand, the grating fiber 76 forms a resonant structure with the grating fiber 73, and makes the doped fiber 72 to oscillate at an oscillation wavelength in the vicinity of 530 nm, and simultaneously, carries out the changing of a transverse mode into a multi-mode by broad reflection characteristic of the grating fiber 53 in the vicinity of 530 nm. Consequently, generation of a low-coherence laser beam is enabled.

Meanwhile, it is assumed that the grating fibers 73, 76 have a double-clad structure which does not include doping material. Thereby, light which is transmitted through the doped fiber 72 is entered into the grating fibers 73, 76 highly efficiently.

Figure 10:
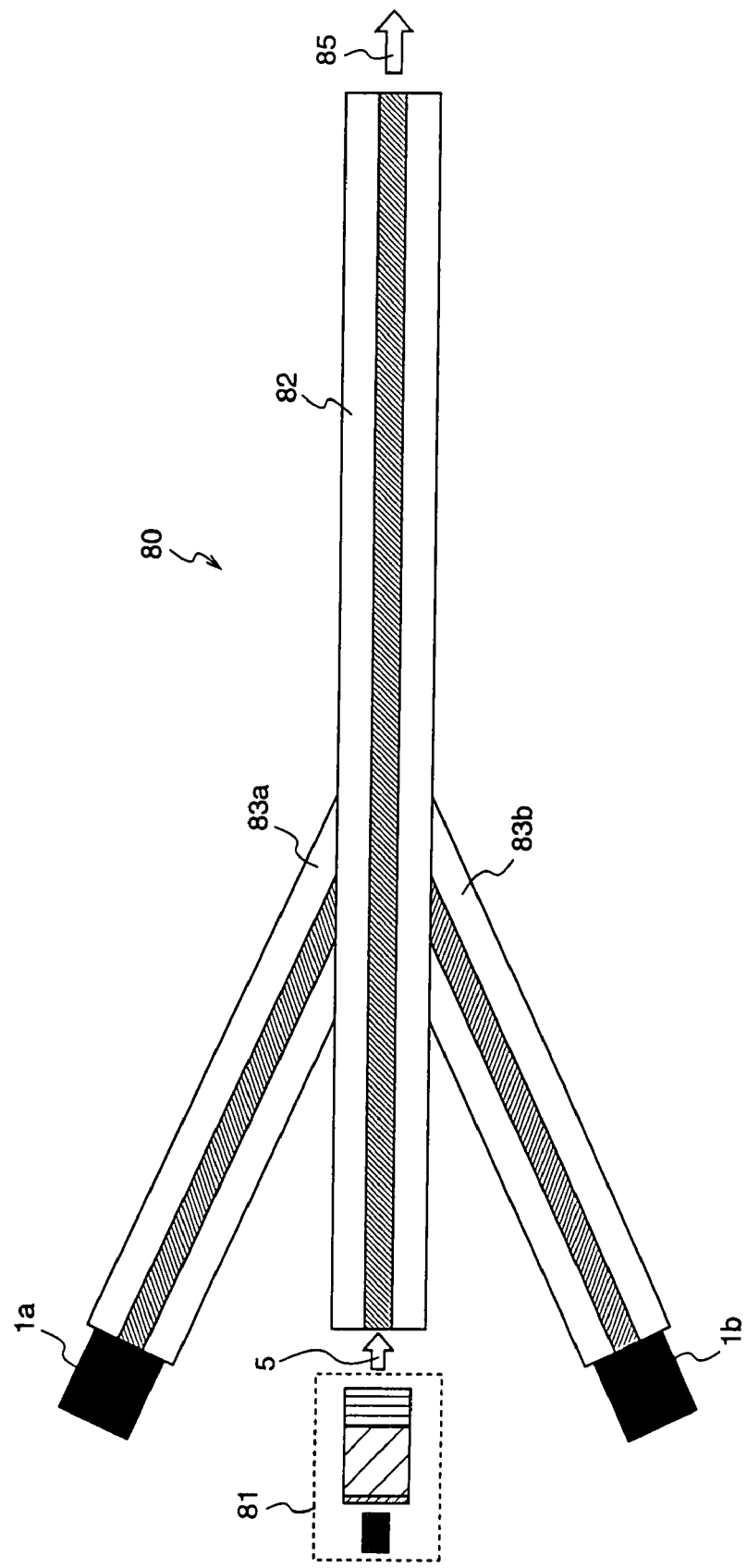
FIG. 10 . . .

Furthermore, a fiber amplifying system as shown in FIG. 10 is also effective as a construction of the laser light source using a fiber laser as described above. FIG. 10 is a diagram illustrating a construction of a laser light source having the fiber amplifying system.

In FIG. 10, reference numerals 1a, 1b denote GaN semiconductor lasers, reference numeral 81 denotes a seed source, reference numeral 5 denotes seed light from the seed source, reference numeral 82 denotes a doped fiber, reference numerals 83a, 83b denote couplers, reference numeral 80 denotes a laser light source, and reference numeral 85 denotes output light from the laser light source.

The seed source 81 is a light source having a wavelength in the vicinity of 530 nm that utilizes a semiconductor laser or wavelength conversion. Here, it is assumed that the seed source 81 has the construction illustrated in FIG. 1. Accordingly, the output light 5 whose longitudinal mode has been changed into a multi-mode is outputted from the seed source 81.

Hereinafter, the operation will be explained. First, the doped fiber 82 is excited by a plurality of the GaN lasers 1a, 1b through the couplers 83a, 83b. When the seed light 5 whose longitudinal mode has been changed into a multi-mode and outputted from the seed light source 81 is entered into the excited doped fiber 82, it is amplified by the doped fiber 82 and is outputted as the output light 85 having increased output power. Meanwhile, since the longitudinal mode of the seed light has been changed into a multi-mode, the output light 85 becomes a multi-mode output.

As described above, the laser light source according to this second embodiment comprises the GaN laser 1 having an oscillation wavelength in the vicinity of 440 nm, the doped fiber 72 which is doped with trivalent praseodymium ion ($Pr^{3+}$), and the grating fiber 53 on which a grating having narrow-band reflection characteristics in the vicinity of 530 nm is formed, wherein the oscillation wavelength of the doped fiber 72 is changed into a multi-mode by exciting the doped fiber 75 with the GaN laser 1, and the oscillation wavelength of the doped fiber 72 is controlled by the reflection characteristic of the grating fiber 73. Therefore, it is enabled to realize a small, high output power, and low coherent green light source.

Figure 11:
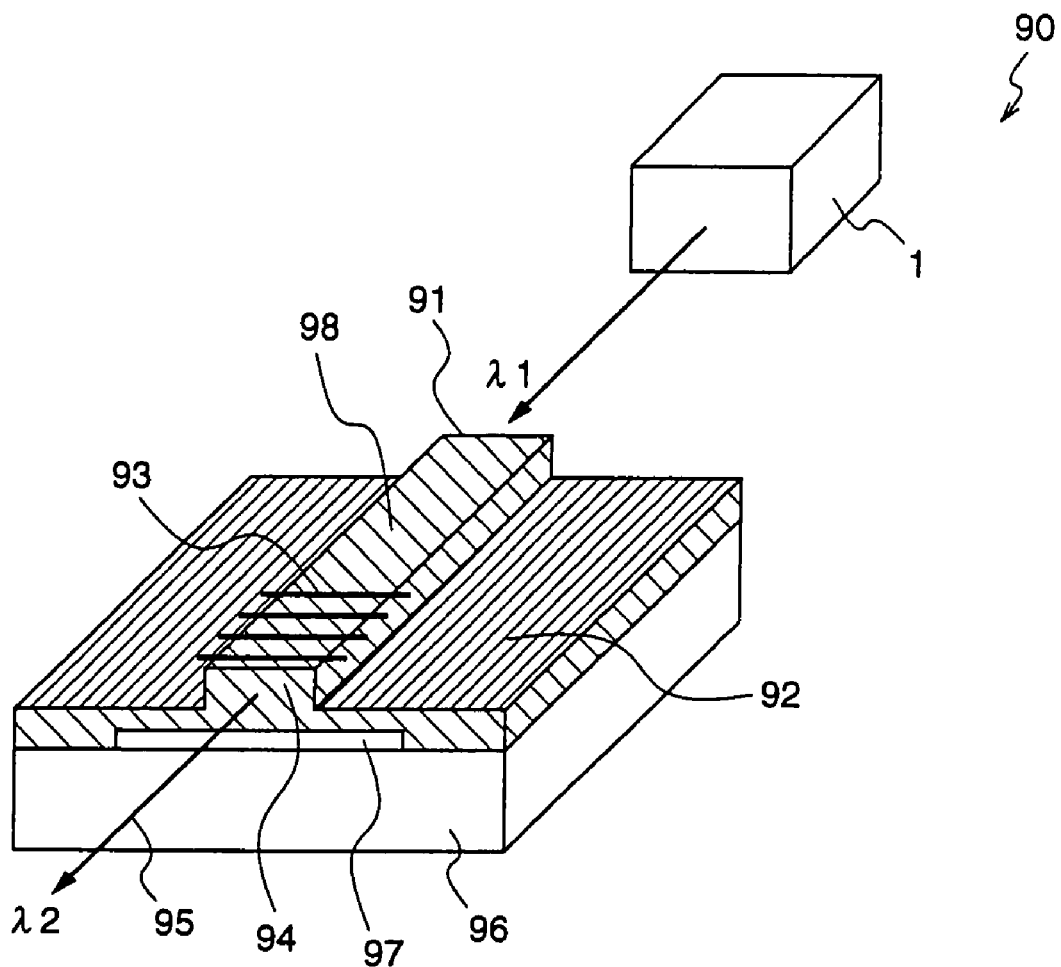
FIG. 11 . . .

Meanwhile, as shown in FIG. 11, a similar construction can be realized by a wave-guide laser 90 using an optical wave-guide as a laser material in the place of a doped fiber. FIG. 11 is a diagram illustrating a construction of the wave-guide laser according to this second embodiment.

In FIG. 11, reference numeral 1 denotes a GaN laser, reference numeral 96 denotes a substrate, reference numeral 97 denotes a gap portion, reference numeral 98 denotes a ridge wave-guide, reference numeral 91 denotes an incident portion, reference numeral 92 denotes a laser medium, reference numeral 93 denotes a grating, reference numeral 94 denotes an output portion, reference 90 denotes a wave-guide laser light source, and reference numeral 95 denotes output light from the wave-guide laser light source.

The laser material 92 which is doped with $Pr^{3+}$ is attached on the substrate 96 by direct bonding, and between the laser material 92 and the substrate 96 is optically separated by a gap structure 97. The ridge wave-guide 98 can be constructed by processing the laser material 92 in a ridge shape. The incident portion 91 to which light from the GaN laser 1 is entered is provided on one end of the ridge wave-guide 98, and the output portion 94 from which the output light 95 is outputted is provided on the other end, and reflective a multilayered film (not illustrated) is deposited on the incident portion 91 and on the output portion 95, and laser oscillation is carried out at the output portion 95. Further, the grating 93 is formed in the vicinity of the output portion 95 of the ridge wave-guide 98 as multi-mode means.

Hereinafter the operation will be explained. First, the laser medium 92 is excited by incident light from the GaN laser being entered into the ridge wave-guide 98, and generation of green light in the vicinity of 530 nm is enabled. A YGA or YLF crystal which is doped with $Pr^{3+}$, ceramic materials or the like can be used as a material for the laser medium 92.

As multi-mode means in the laser light source 90 using an optical wave-guide, it is effective to change a longitudinal mode into a multi-mode by the grating 93 formed on the ridge wave-guide 98. By using a wave-guide, an improvement in the power density of light can be achieved, whereby it is effective for improving the output of and miniaturizing the light source. Further, a transverse mode which transmits through the ridge wave-guide 98 can be changed into a multi-mode by increasing the size of the ridge wave-guide 98. For example, if the width of the ridge wave-guide is widened to around 100 μm, highly efficient binding with a high power wide strap GaN semiconductor laser is enabled, and thus it is effective for improving output and changing into a multi-mode.

Meanwhile, as means for changing a longitudinal mode of the wave-guide laser light source into a multi-mode, providing an external grating on the former stage of the incident portion 91 and injecting wavelength selected light from outside by the external grating, attaching a grating mirror or the like on the output portion 94 of the ridge wave-guide 98, bonding a fiber grating on the incident portion 91 and the output portion 94 of the ridge wave-guide 98, or forming a grating on the output portion 94 side of the ridge wave-guide 98 and feeding back light from out side by the grating can be used other than forming the grating 93 on the ridge wave-guide 98 as described above.

Further, also in this second embodiment, a doping material which is added to the doped fiber 72 is not limited to $Pr^{3+}$, and $Eu^{3+}$, $Sm^{3+}$, $Ce^{3+}$, $Tm^{3+}$, $Tb^{3+}$, $Eu^{2+}$, or the like can be doped or co-doped as similarly in the first embodiment.
(Third Embodiment)

Figure 12A:
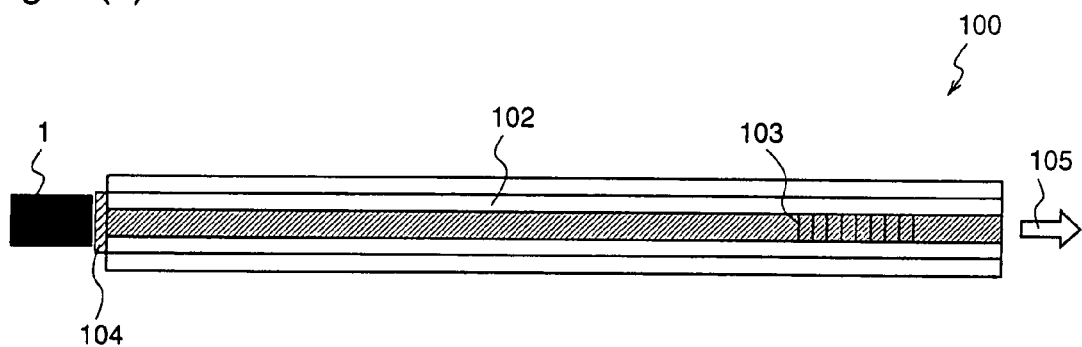
FIG. 12(a) is a cross-sectional view of that construction and FIG. 12(b) is a cross-sectional view of the fiber.
Figure 12B:
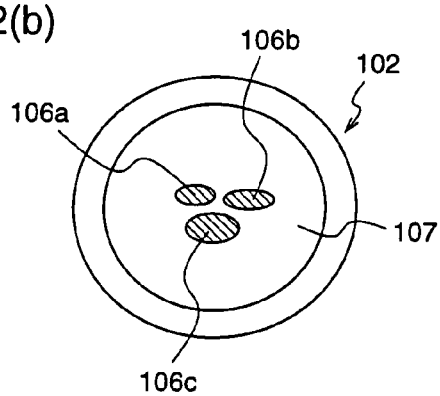

In this third embodiment, description will given of a construction in which output light is changed into a multi-mode by providing a plurality of cores in a single fiber FIG. 12(a) is a diagram illustrating a construction of a light source according to this third embodiment, and figure 12(b) is a diagram illustrating a cross-sectional view of the doped fiber.

In FIG. 12, reference numeral 1 denotes a GaN system semiconductor laser, reference numeral 102 denotes a double-clad doped fiber which is doped with trivalent praseodymium ($Pr^{3+}$), reference numeral 103 denotes a grating, reference numeral 104 denotes a multilayer mirror 104, reference numeral 100 denotes a laser light source, and reference numeral 105 denotes output light from the light source.

The core of the doped fiber 102 comprises a plurality of cores 106a-106c and a clad 107. The multilayer mirror 104 is a dichroic mirror which transmits light of less than 500 nm and reflects light of more than 500 nm. The grating 103 directly affects periodical change in reflectances of respective cores 106a-106c of the doped fiber 102.

Hereinafter, the operation will be explained. First, when light in the vicinity of 440 nm from the GaN laser 1 is entered into the clad 107 of the doped fiber 102, $Pr^{3+}$ ions which are added to the doped fiber 102 are excited, and thereby generate green light in the vicinity of 530 nm.

It is necessary to reduce speckle noises by reducing the coherence of the light source to use visible light for a display purpose. In order to reduce speckle noises by reducing the coherence of the light source, it is effective to change oscillation spectrum of a laser into a multi-mode.

In FIG. 12, since a single fiber 102 has a plurality of cores 106a-106c, each core can oscillate at different wavelengths.

Further, if respective core 106a-106c is made to have at least either different diameter, different ellipticity, or different refractive index so as to have different refractive indexes from one another, reflection takes place in respective cores at different reflection wavelengths even if the grating is not formed on respective cores as shown in FIG. 12(a) but is formed directly on the doped fiber as shown in FIG. 9. As a result, since a plurality of cores 106a-106c respectively oscillate at different wavelengths, the output light becomes a light source having a plurality of wavelengths.

Further, if a single fiber is provided with a plurality of cores 106a-106c, it is enabled to improve the output power.

Improvement of the output power of the fiber 102 is restricted by the power density within the fiber 102. In particular, since it is difficult to improve the power intensity of the fiber laser 102 in the visible light range compared with an infrared fiber, it is necessary to reduce the power intensity by enlarging the core diameter in order to realize the improvement of output power. However, if the fiber diameter becomes too large, the changing into a multi-mode becomes intense, and thereby a lot of transverse modes are transmitted in the same fiber 102. With this kind of condition, excitation energy is dispersed into many transverse modes, thereby oscillation efficiency is lowered as well as high reflection at the fiber grating 103 becomes difficult, and laser oscillation becomes difficult. The plurality of core 106a-106c solves this problem. Here, improvement of output is made possible by reducing the power densities in respective cores 106a-106c, and by condensing lights outputted from respective cores.

Meanwhile, as described above, when a plurality of cores is provided and this laser light source is used for normal laser usage, deterioration of focusing characteristics occurs because output lights cannot be collected at one point. However, when it is used for display usage, the deterioration of focusing characteristics does not become a problem because output light is displayed on a display by being magnified.

Further, if the plurality of cores 106a-106c is provided in a single fiber, it is enabled to improve efficiency of output light. Improving absorption efficiency of blue light which is transmitted through the clad in the fiber is effective for improving the efficiency of the fiber. Here, the proportion of the core 116 with relative to the clad 117 in the cross section of the fiber 102 is increased by providing the plurality of cores 106a-106c, thereby an absorption coefficient which indicates absorption of light that is transmitted through the clad by the core can be increased to several folds.

Further, by adopting an asymmetric structure when providing the plurality of cores 106a-106c so as that the arrangement positions of respective cores 106 in the cross section of the fiber 102 to be noncentrosymmetric, improving the efficiency of the fiber laser can be realized. When the fiber has a centrosymmetry structure, light which is transmitted through the clad has an axial symmetry mode which makes the light to avoid the core and to be transmitted through the clad, whereby reduces absorption of the light into the core. In order to prevent this, if the plurality of cores 106a-106c is provided in the fiber 102, a symmetric core arrangement can be facilitated. Therefore, absorption efficiency of the light that passes through the clad into the core can be increased, and thereby oscillation efficiency of the fiber laser can be improved.

As another way to prevent the reduction in absorption efficiency of light by an axially symmetric mode, it is effective to arrange the plurality of cores in a spiral pattern. If the cores are arranged in this way, since the lengths of the cores can be made to be longer than the fiber length, absorption of light into the cores is further increased and the oscillation efficiency can be also improved.

Further, if the plurality of cores 106a-10c is provided in a single core, since each core diameter can be made to be relatively small, the power density of a laser beam is improved and by reduction in a threshold, oscillation efficiency is improved.

As described above, the laser light source according to this third embodiment comprises a single fiber which is provided with the plurality of cores 106a-106c, wherein the grating 103 is formed on each core. Therefore, output light which is changed into a multi-mode can be outputted, and as a result, a low coherence laser light source can be realized. Accordingly, improvement of output and efficiency of the output light can be realized.

Meanwhile, by employing a plural core structure, a large output power laser light source is enabled. Furthermore, if a lot of cores that are changed to have different core diameters and reflectances are provided in the fiber, a spread of spectrum of generated light can be freely adjusted.

(Fourth Embodiment)

In this forth embodiment, description will be given of a laser light source which can output a plurality of lights having different wavelengths which are changed into multi-modes from a single light source.

For a laser display, multi-wavelength light sources of three primary colors, i.e., red, green, and blue, or more are needed in a visible area. If generation of laser beams of more than two different wavelengths is enabled by a single light source, miniaturization and simplification of the device is enabled due to the miniaturization of the light source.

Figure 13:
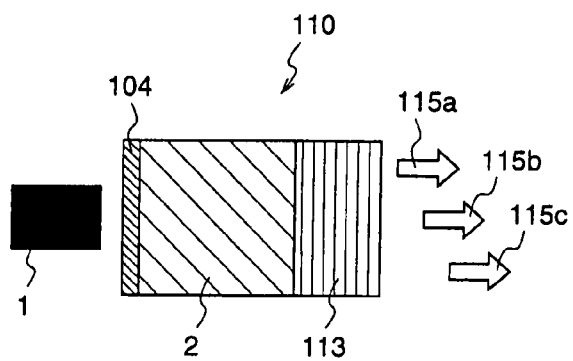
FIG. 13 . . .

FIG. 13 is a diagram illustrating a construction of a laser light source according to this forth embodiment. In the figure, reference numeral 1 denotes a GaN laser, reference numeral 2 denotes a laser medium which is doped with $Pr^{3+}$, reference numeral 113 denotes a reflector, reference numeral 104 denotes a multi-layer mirror which transmits light of less than 500 nm and reflects light of more than 500 nm, reference numeral 110 denotes a laser light source, reference numerals 115a-115c denote output lights from the laser light source.

For example, as shown in FIG. 8, $Pr^{3+}$ has red fluorescence in the vicinity of more than 635 nm other than a green fluorescent characteristic in the vicinity of 530 nm. Accordingly, by using this characteristic, if a green laser beam and a red laser beam are to be generated at the same time from the laser material 2 excited by the GaN laser 1, generation of a plurality of lights from a single light source is enabled. Furthermore, among the blue light in the vicinity of 440 nm from the GaN laser 1 as an excitation light source, if light which has not been absorbed by the laser material 2 is taken out to the outside, a multi-wavelength light source for simultaneously generating lights of red, green, and blue can be realized.

Further, if a volume grating 113 which has a reflection characteristic in red and green wavelength ranges is used as the reflector 113, and the volume grating 113 is designed to have a broad reflection characteristic in each of red and green wavelength ranges, changing of a longitudinal mode into a multi-mode can be carried out at the same time by controlling the oscillation wavelength of the laser medium 2. As a result, it is enabled to take out low-coherent red and green lights efficiently.

Furthermore, if high frequencies are superposed on the output light of the GaN laser 1, stabilization of blue light outputted from the GaN laser 1 and changing into a multi-mode can be realized. This allows realizing reduction in coherence of blue light when using the blue light as a multi-wavelength light source, and thereby all the output lights 115a-115c outputted from the laser light source 110 can be changed into a multi-mode. As a result, it is enabled to take out low coherent RGB lights effectively.

Meanwhile, though simultaneous generation of green light and red light and simultaneous generation of red, green, and blue lights are described in this forth embodiment, it is not limited to the above combinations and simultaneous generation of green light and blue light, or red light and blue light is also possible. Further, though it is described in this fourth embodiment that the multilayer mirror 104 transmits light of less than 500 nm and reflects light of more than 500 nm, it can also be a multilayer mirror which reflects output light, for example, light having a wavelength range in such as red light and green light, from the laser light source.

(Fifth Embodiment)

In this fifth embodiment, description will be give of a laser light source which can output a plurality of lights having different wavelengths from a single fiber.

FIG. 14 is a diagram illustrating a construction of a laser light source when a plurality of lights having different wavelengths is outputted from a single fiber. FIG. 14(a) is a diagram illustrating a cross-section view of the laser light source and FIG. 14(b) is a diagram illustrating a cross-section view of the fiber.

In FIG. 14, reference numeral 1 denotes a GaN laser, reference numeral 122 denotes a doped fiber, reference numeral 104 denotes a multilayer mirror which transmits light of less than 500 nm and reflects light of more than 500 nm, reference numerals 123a, 123b denote fiber gratings, reference numeral 120 denotes a laser light source, reference numeral 125a, 125b denote output lights from the laser light sources.

As shown in FIG. 14(b), the doped fiber 122 is a fiber having a double-clad structure which has two cores, and different additives are doped to the core A126a and the core B126b. Here, mounts of Pr and Ho are added differently to each of the cores. By changing additives and additive amounts, oscillations of different wavelengths become possible in respective cores. For example, if it is made that green light in the vicinity of 530 nm is generated at the core A126a and red light of a wavelength in a vicinity of 620 nm is generated at the core B126b, simultaneous generation of red, green, and blue lights, in conjunction with blue light in the vicinity of 440 nm generated by the clad in the single fiber, is enabled.

Furthermore, if a core for generating blue-green light in the vicinity of 480 nm is added, four colors of lights can be generated at the same time, thereby color reproducibility is dramatically improved. As described above, by changing additives or additive amounts to the plurality of cores, generation of lights having different wavelengths from the plurality of cores is enabled, and thereby a plurality beams of high output power visible light can be generated by a simple construction.

Normally, when a grating is formed on a doped core, an oscillation wavelength is changed due to a temperature rise of the core. Therefore, a grating is formed on each core by bonding the doped core and a non-doped fiber to which the grating is attached. However, when a fiber has a plurality of cores, fiber boding is difficult to carry out and losses are increased at the boding portions. Therefore, it is preferable to form the grating directly on each core as shown in FIG. 12.

Further, when each core has a different propagation coefficient, if gratings having the same period are formed on the cores, oscillation at a different wavelength is enabled. Thereby, the spectrum becomes a multi-mode.

Meanwhile, when generating a plurality of largely different wavelengths in different cores, for example, generating green light in the vicinity of 520 nm and red light in the vicinity of 620 nm, it is necessary to vary periods of gratings formed on respective cores. One way to form a grating in the above case is, first, to change a doping material added to each core so as to form a core having a strong oscillation characteristic in a wavelength in the vicinity of 520 nm and a core having a strong oscillation characteristic in the vicinity of 620 nm, and next, to write a grating having a reflection wavelength in the vicinity of 620 nm and a grating having a reflection wavelength in the vicinity of 520 nm directly on the both cores in serial. While a resonance condition is established in two wavelengths in the fiber, since the oscillation wavelength of a laser is determined by gains and losses, strong gains are obtained in a wavelength band having a strong oscillation characteristic. Therefore, even if the grating has reflection wavelengths of both 620 nm and 520 nm, the oscillation is carried out at the wavelength with larger gains.

Another way is to form a grating having a certain wavelength on each core. Thereby, oscillation can be carried out in respective cores at different wavelengths. One way to form a different grating on each core is to bond a fiber 122 as shown in FIG. 14(b), and grating fibers 129a, 129b, whose cross-sectional structures have a similar double-core structure, in parallel. A grating A123a and a grating B123b are respectively formed on the grating fibers 129a, 129b. The gratings A, B are formed by doping Ge (germanium) to only one of cores of each fiber, and forming the grating structures by infrared. Since a grating is thereby formed selectively on one of the double cores of respective grating fibers 129a, 129b, it is enabled to carry out reflection on respective cores at different wavelengths.

Further, when generating three wavelengths of red, green, and blue from the fiber 122 at the same time, it is preferable to add a transparent core for light in the vicinity of 440 nm as a GaN laser beam. The reason for this is that blue light is not sufficiently outputted from the output end plane because it is absorbed by a core which is doped with $Pr^{3+}$. Accordingly, it is difficult to use the blue light for usage of a display or the like that uses RGB at the same time. Therefore, if the fiber 122 further includes a transparent core as described above, since a part of blue light from the GaN laser 1 as a pump light source is outputted from the output portion through this transparent core, RGB lights can be outputted at the same time.

Further, if cores are to be provided in the fiber 122 in a number larger than the number of outputted wavelengths in order to output same wavelength light from a plurality of cores, it is enabled to adjust luminances of the plurality of wavelength lights which are outputted from the fiber, and thereby it is effective. For a display use, it is desired that green light as neutral light has stronger intensity than other wavelength lights. Consequently, it is necessary to strengthen the luminous intensity of green light among RGB lights. Therefore, among the plurality of cores which are provided in the fiber, if the number of cores for generating green light is increased, the output of green light can be increased with relative to other wavelengths, whereby the optimum ratio of RGB for color representation in a display can be configured.

By the way, when using the outputs of RGB lights from the above-described single fiber 122 by switching the same, it is desired not to output RGB lights from the output end of the single fiber 122 at the same time but to output one color at a time by switching oscillation wavelengths. By doing so, only the wavelength required at that time can be excited and outputted without wasting the light of the pump light source 1, and thereby power consumption can be reduced.

Hereinafter, description will be given of a construction of a laser light source when RGB lights outputted from the single fiber are switched and outputted.

FIG. 15 is a diagram illustrating a construction of a laser light source when output light is switched and outputted. Reference numeral 1 denotes a GaN laser, reference numeral 132 denotes a doped fiber, reference numerals 104, 133 denote multilayer mirrors, reference numeral 136 denotes a wavelength selection filter, reference numeral 137 denotes a driving device for driving the wavelength selection filter, reference numeral 138 denotes a condenser optical system, reference numeral 130 denotes a laser light source, and reference numeral 135 denotes output light from the laser light source. A resonator structure is formed by the multilayer mirrors 133, and 104, and here, the wavelength selection filter 136 is inserted in the resonator. Further, it is assumed that the multilayer mirror is a reflection mirror which transmits light of less than 500 nm and reflects light of more than 500 nm, and the second multilayer mirror 133 is a reflection mirror which transmits a certain amount of light of more than 500 nm.

Hereinafter, the operation will be described. When light in the vicinity of 440 nm from the GaN laser is entered into the doped fiber 132, the output from the core of the fiber 132 is condensed by the condenser optical system 138 and is reflected by the multilayer mirror 133 in a certain amount. The wave length selection filter 136 is driven by the driving device 137, and temporally switches transparent wavelengths. Since the resonator oscillates at a wavelength with small losses, it oscillates at the transparent wavelength selected by the drive apparatus 137 at that time. As described above, if the wavelength selection filter 136 and driving the filter are provided to temporally switch output wavelengths outputted from the laser light source, a plurality of high output power wavelengths can be obtained from the laser light source. As the wavelength selection filter 136, a multilayer film, a switch using an electro-optical effect, a polarization switch, an acousto-optic element or the like can be used.

Further, as another construction, an oscillation wavelength from the fiber 142 can be switched by providing a selection switch 146 on the tip of the fiber 142, and connecting a grating fiber A 149a and a grating fiber B 149b on which reflection gratings 143a and 143b that correspond to the output light 145 are respectively formed to the tip of the selection switch 146, and carrying out switching between the grating fibers A149a and B149b with the selection switch 146, as shown in FIG. 16(a). Furthermore, if a fiber C 149c on which a grating is not formed is provided, pump light from the GaN laser 1 can be taken out directly, as shown in FIG. 16(b). For example, if it is assumed that the grating 143a has a reflection wavelength of green light and the grating 143b is a reflection wavelength of red light, temporally switching the outputs of RGB lights 145a-145c is enabled by switching connections of respective fibers 149a-149c with the switch 146.

As yet another construction, there is a way of using seed light sources 151a, 152b as shown in FIG. 7. For example, the laser light source 150 bonds a GaN laser 1 as a pump light source with the clad of the doped fiber 152. Then, a red laser 151a and a green laser 152b are bonded with the fiber 152 as seed light sources. The fiber 152 excited by the pump light source 1 becomes a light amplifier and amplifies light of the red laser 151a and the green laser 151b. Then, by modulating the outputs of the red laser and the green laser, output modulation of red light 155b and green light 155c is enabled. Blue light 155a is an output from the GaN laser 1 as a pump light source.

Here, what becomes a problem in the fiber output of visible light is crud on an output end face. Laser trap effect, which draws particles such as suspended solids or gas in the air, is likely to take place at the output end face of the fiber from which visible light having high power density is generated, thereby the fiber end face is tainted. The crud is accumulated on the fiber end face, thereby causing a reduction in the output. It is effective to reduce the power density at the fiber end face so as to prevent a reduction in the output. Broadening the core in a tapered shape in the vicinity of the output of the fiber is an effective way. This can be realized by connecting a tapered fiber to the output end of the fiber. Further, it is possible to further reduce speckle noises by broadening the core to increase a transverse mode.

(Sixth Embodiment)

In the fifth embodiment, though description was given of the construction in which a doped fiber of a laser light source comprises a single fiber and a plurality of cores are provided in the fiber, in this sixth embodiment, description will be given of a doped fiber which comprises a plurality of fibers.

FIG. 18(a) is a diagram illustrating a construction of a laser light source according to this sixth embodiment, and FIG. 18(b) is a diagram illustrating a cross-section of the doped fiber. Reference numeral 1 denotes a GaN system semiconductor laser, reference numeral 182 denotes a doped fiber, reference numerals 104, 133 denotes multilayer mirrors, reference numeral 180 denotes a laser light source. As shown in FIG. 18(b), the doped fiber 182 in this sixth embodiment has a bundled fiber structure in which double-clad fibers 182a-182g doped with $Pr^{3+}$ are in a plurality of bundles, and in each of the fibers 182a-182g, a core 186 is doped with $Pr^{3+}$ and other material is also added. Further, a clad 187 is provided around the core 186 and light of the GaN laser 1 can be transmitted by the clad 187. As described above, if the fiber 182 is designed to have a bundled fiber structure, it becomes advantageous in increasing output power, increasing efficiency, and multiplying wavelength as similarly in the case of the above-described plural core structure.

Since the fiber 182 has large absorption to visible light, when the power density within a single fiber is increased, oscillation efficiency of the laser is reduced. Therefore, it is preferable to limit an output from a single core to be less than several hundred watts in order to increase output and to increase efficiency. Accordingly, if a fiber bundle is used for the fiber 182 as shown in this sixth embodiment, it is enabled to increase output without increasing the power density of each fiber. Further, if a dope amount of Pr added to the cores 186 of respective fibers 182a-182g, a type of co-doping materials such as Ho, Yb, Nd, Er, and Cr, and a dope amount thereof are changed, each of the fibers 182a-182g is enabled to oscillate at a different wavelength. As a result, a plurality of spectra will be mixed whereby speckle noises can be reduced.

Furthermore, if oscillation wavelengths of respective fibers 182-182g are to be differed hugely, simultaneous generation of RGB lights and four color light generation including blue-green light in the vicinity of 490 nm in addition to the RGB lights become possible. Accordingly, a display light source having high color reproducibility can be realized.

Further, by constituting the fiber 182 with a plurality of fibers, forming a grating structure independently on each of the fibers 182a-182b, and connecting each of the fibers 182a-182g with a fiber on which a fiber grating is formed can be carried out easily. Accordingly, the output wavelength of each of the fibers 182a-182g can be easily adjusted, whereby the oscillation wavelength of each of the fibers 182a-182g can be controlled more easily.

Further, when a plurality of fibers is used for the fiber 182, output of RGB lights becomes easy.

Hereinafter, with reference to FIG. 19, description will be given of carrying out RGB light output in a laser light source comprising a plurality of fibers. Here, a case where a dope fiber comprises three fibers will be described.

Figure 19A:
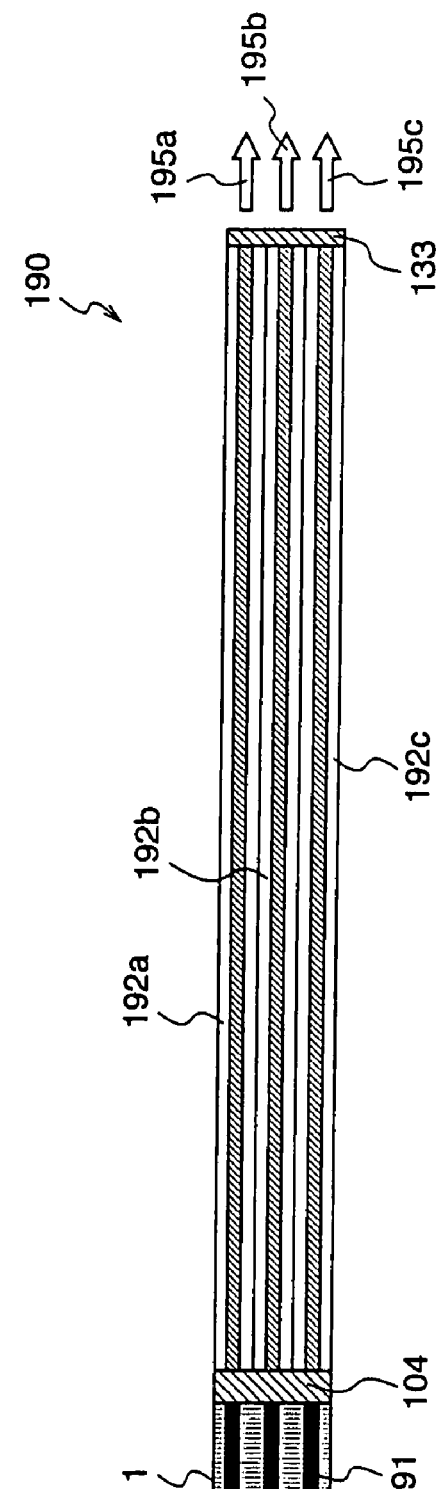
FIG. 19(a) is a diagram illustrating another construction and FIG. 19(b) is a diagram illustrating a cross-section of the fiber.

In FIG. 19, reference numeral 191 denotes a wide-strap GaN laser, reference numeral 192 denotes a doped fiber whose core is doped with $Pr^{3+}$, reference numeral 133 denotes a multilayer mirror, reference numeral 190 denotes a laser light source, and reference numerals 195a-195c denote output lights which are outputted from the laser light source.

Figure 19B:
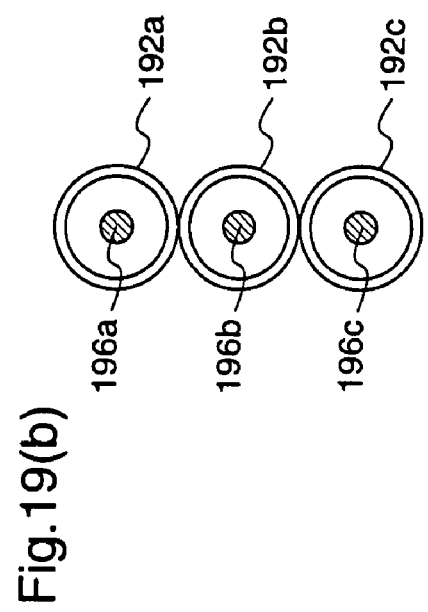

The wide-strap GaN laser 191 has a plurality of stripes 191a-191c. Lights which have been outputted from respective stripes 191a-191c respectively excite a doped fiber A192a, a dope fiber B192b, and a doped fiber C192c. As shown in FIG. 19(b), respective doped fibers 192a-192c are different doped fibers, and respective cores 196a-196c oscillate at different wavelengths. Here, for example, the doped fiber A192a oscillates a red laser, the doped fiber B192b oscillates a blue laser, and the doped fiber C192c does not oscillate a laser and directly transmits blue light of the GaN laser 191. As described above, by exciting respective fibers 192-192c with different lasers, RGB lights can be generated at the same time as well as outputs of respective wavelengths can be controlled independently. Further, by controlling outputs from respective stripes 191a-191c of the GaN laser 191 independently, strengths of RGB and the ratio thereof can be freely controlled. Thereby, it is enabled to freely control a color of light outputted from the fiber 192, and by modulating respective outputs 195a-195c, color control with low power consumption can be realized.

Figure 17:
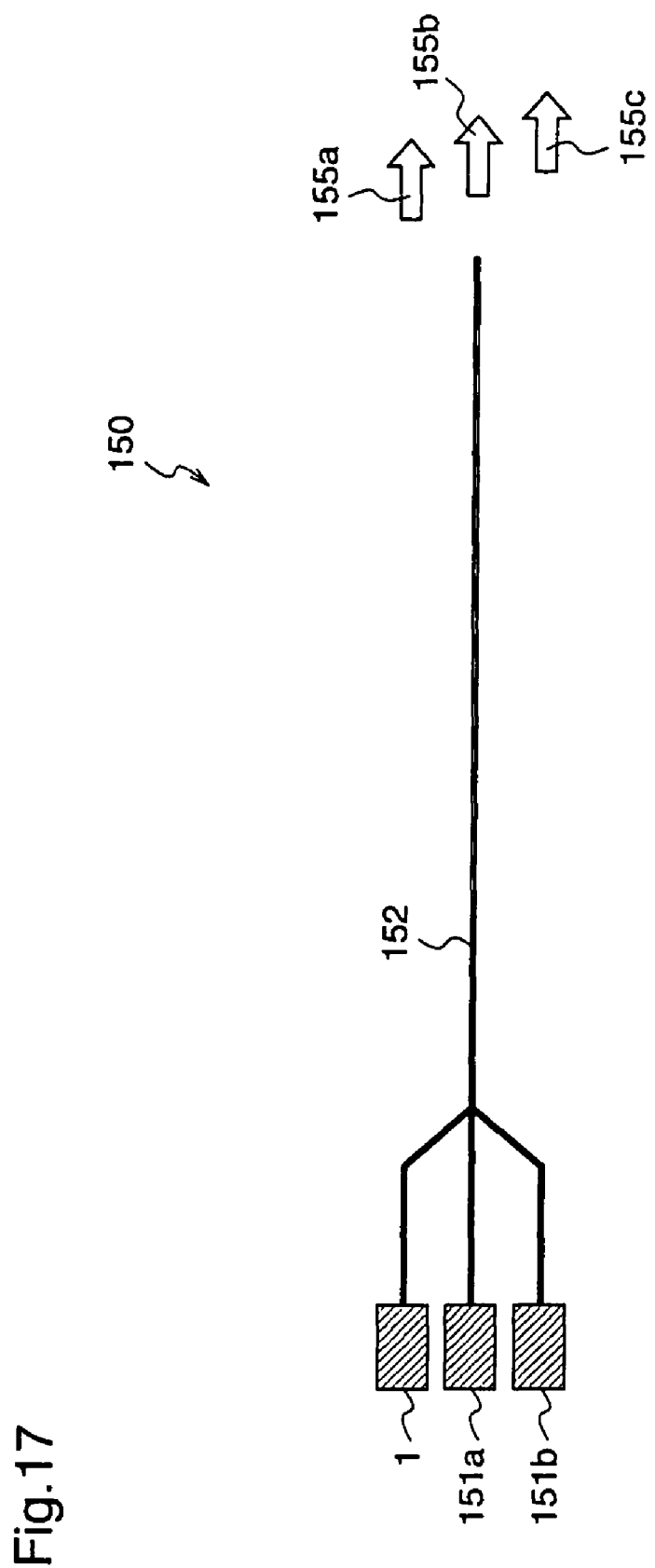
FIG. 17 . . .

Further, in this six embodiment, a construction in which a fiber is used as a light amplifier as shown in FIG. 17 so as to amplify light from a seed light by the fiber can be used.

In this case, by injecting light from the pump light source 1 and the seed light source to each of the fibers 192a-192c and amplifying the light from the seed light source by respective fibers 192a-192c, it is enabled to obtain high output power and to switch the outputs at very high speed.

Meanwhile, though the case where the core of the fiber is a single core is described in this sixth embodiment, if a plurality of cores is provided to the core of each fiber as described in the third embodiment, it becomes easy to increase output power and to increase efficiency. Further, if the core of each fiber is designed to have a plurality of cores, it becomes easy to broaden the spectrum whereby light having low speckle noises can be realized.

Furthermore, single generation of red or generation of red and blue is also effective other than the construction described in this sixth embodiment. Though it is possible to realize a short-wavelength red laser by a semiconductor laser, it is difficult to improve characteristics of the semiconductor laser by a short-wavelength red laser of a wavelength of 600-6400 nm which is effective for display devices. To the contrary, if a laser light source is constructed as in this sixth embodiment, a red laser can be realized while efficiency and output power thereof are increased.

Furthermore, according to the construction of the laser light source in this sixth embodiment, since changing to a multi-mode can be carried out easily, speckle noise reduction is enabled whereby a high image quality display device can be realized.

Further, in the laser light source of the present invention which comprises a fiber, the radiation structure of the fiber is important. When converting blue pump light into green light or red light, energy loss is generated due to the wavelength differences, thereby large heating takes place. In particular, since wavelength differences are huge when converting blue light into red light, generation of heat becomes apparent. A problem of decline in oscillation efficiency of laser takes place when the heat generation becomes huge. In order to suppress this, the radiation structure of the fiber becomes important.

Hereinafter, description will be given of the radiation structure of the fiber.

One structure is to contact metal which functions as a heat sink with the fiber. Since heat generation is particularly high in the vicinity of the incident portion of the pump light source, by making the heat sink to be in contact with this portion, efficient laser emission is enabled.

Further, increasing heat conductivity of the coating of the fiber is also effective. By utilizing polymer having high heat conductivity as a coating material, and contacting this polymer with the heat sink to facilitate the radiation of the fiber, the oscillation efficiency of the laser can be drastically improved.

Further, in the case of the bundled fiber structure as shown in FIG. 18, it is effective to fill the gap between the fibers with a material having high heat conductivity. Furthermore, if radiation efficiency is improved by contacting the bundled fiber with the heat sink, it is possible to make the laser oscillation to be highly efficient.

(Seventh Embodiment)

In this seventh embodiment, description will be given of an optical device using the above-described laser light source. Here, as an optical device, description will be given by taking a laser display as an example.

Generally, if RGB lasers are used, a display apparatus having high color reproducibility can be realized. However, with a high-coherent light source, speckle noises due to the interference become apparent whereby the image quality is deteriorated. Since the coherence of the laser light source of the present invention has been reduced by changing a longitudinal mode into a multi-mode, a high-quality image with reduced speckle noises can be realized.

Figure 20:
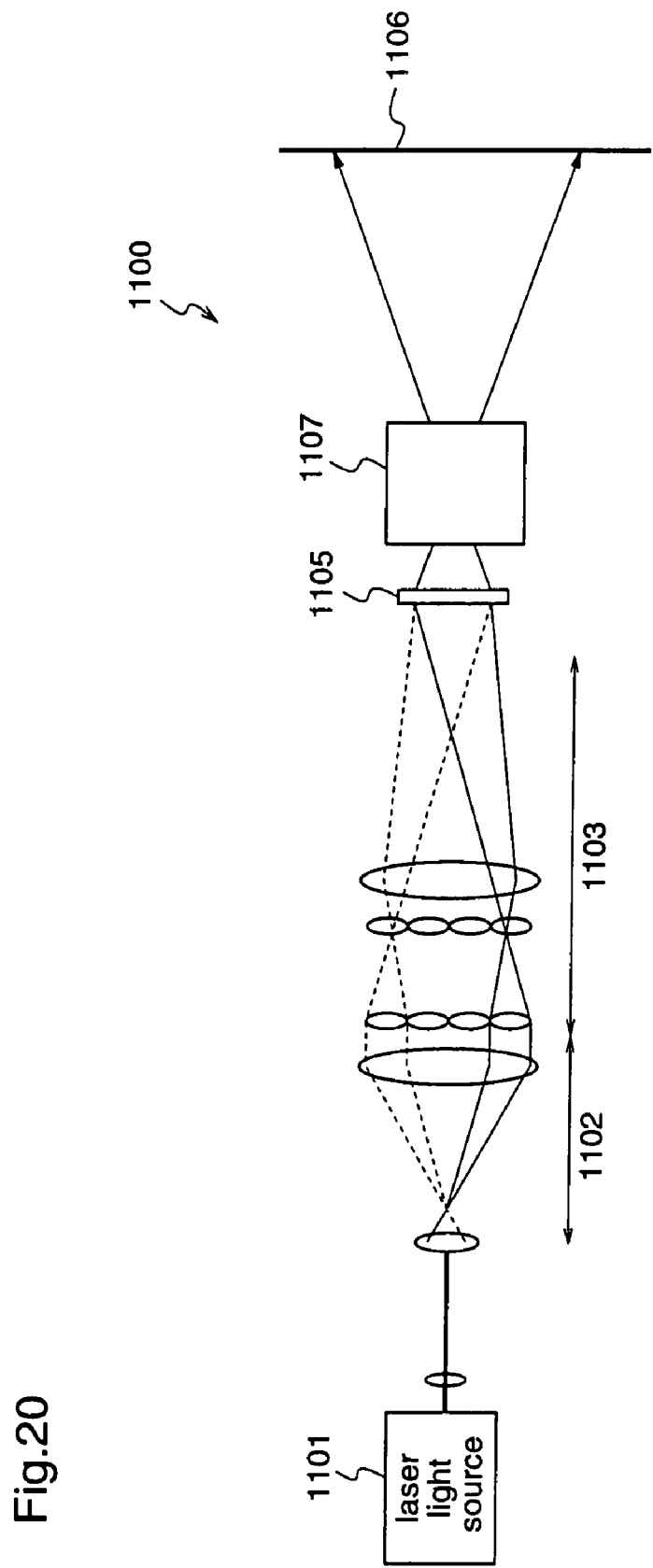
FIG. 20 . . .

FIG. 20 is a diagram illustrating a laser display apparatus using the above-described laser light source. In the laser display apparatus 1100 as shown in FIG. 20, laser light sources for outputting RGB lights are integrated into a laser light source 1101, and light which has been outputted from the laser light source 1101 passes through a collimate optical system 1102 and an integrator optical system 1103, then is image converted by an image conversion element 1105 such as a liquid crystal panel as a two-dimensional switch, and is projected onto a screen 1106 by a projection lens 1107.

In the laser display apparatus 1100 according to this seventh embodiment having the construction as described above, since the laser light source 1101 can generate low coherent light, reduction in speckle noises is enabled whereby improvement of the image quality can be realized. Furthermore, since the laser light source is small in size, and it is capable of outputting high power and highly efficient light, a small and highly efficient laser display apparatus can be realized.

Meanwhile, a reflection-type liquid crystal switch, a DMD mirror or the like can be used as the image conversion element 1105 other than a liquid crystal panel.

Figure 21:
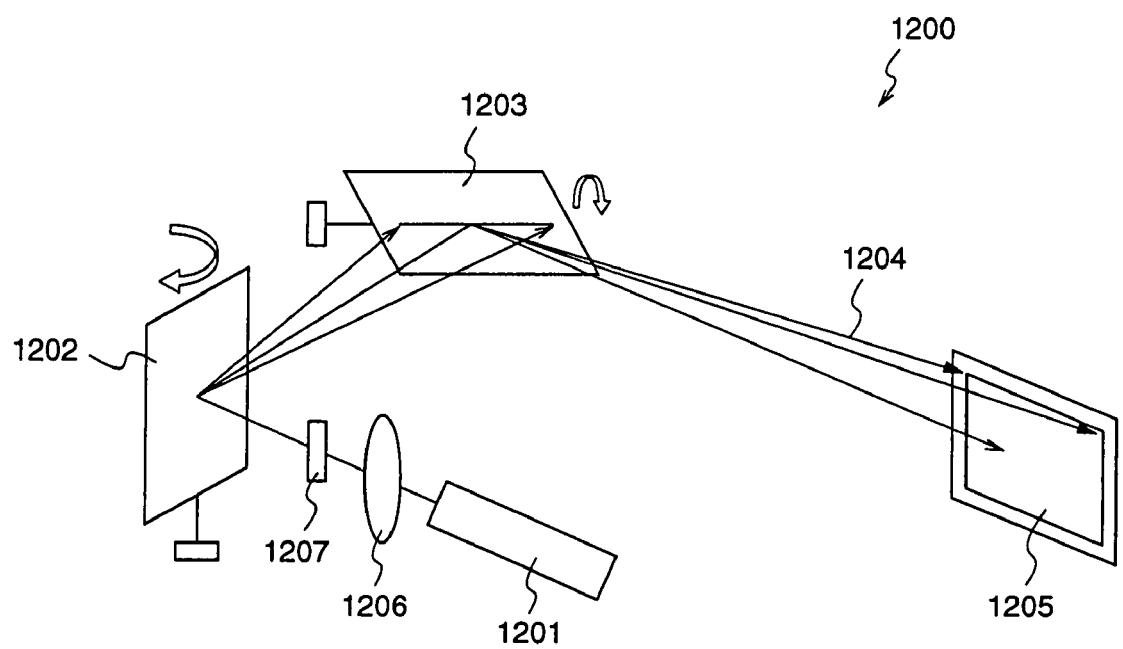
FIG. 21 . . .

Further, a laser display apparatus as shown in FIG. 21 is also effective. FIG. 21 is a diagram illustrating another construction of the laser display apparatus according to this seventh embodiment.

In FIG. 21, a laser beam from a laser light source 1201 is wavelength-switched by a color filter 1206, and is modulated by a modulator 1207, and then, is scanned by mirrors 1202, 1203 thereby to depict two-dimensional images on a screen 1205. In this case, a rapid switching function is required for the laser light source 1201.

As shown in each embodiment described above, in addition to that the laser light source 1201 is small in size, and is capable of outputting high power and highly efficient light, it can also reduce coherence, whereby reduction in speckle noises is possible. Further, the laser light source 1201 can generate RGB lights, or multi-wavelength lights of such as four primary colors or five primary colors at the same time. In this way, when generating multi-wavelength lights from the laser light source 1201 at the same time, color separation is carried out by a color filter 1206, and the lights from the laser light source 1201 are switched in time division to be outputted. Intensity modulation of the lights can be realized by the modulator 1207. Further, it is possible to modulate a laser beam directly, and in this case, the modulator 1207 is not required.

In the above, a small scanning device using MEMS can be used as a beam scanning optical system. Since light outputted from the laser light source 1201 has high beam quality, it excels in focusing characteristic and collimator characteristic. Accordingly, a small mirror such as MEMS can be used. As a result, a scanning laser display can be realized.

Figure 22:
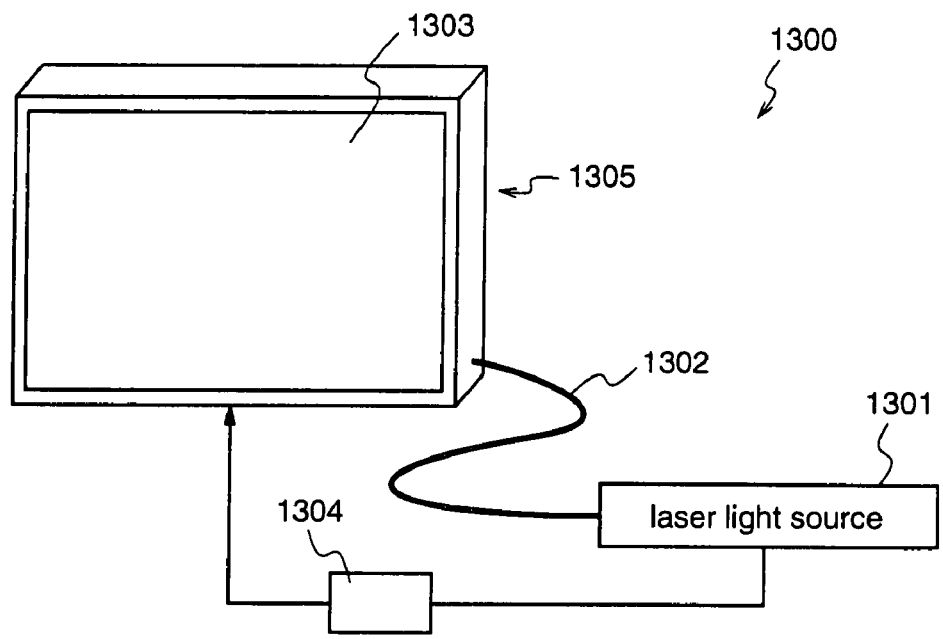
FIG. 22 is a diagram illustrating another construction of the laser display according to the seventh embodiment.

Further, an optical device as shown in FIG. 22 can be also realized. FIG. 22 is a diagram illustrating a construction of a liquid crystal display apparatus according to this seventh embodiment.

In FIG. 22, reference numeral 1301 denotes a laser light source of the present invention which outputs a plurality of wavelength lights, reference numeral 1302 denotes a fiber, reference numeral 1303 denotes a liquid crystal panel, reference numeral 1304 denotes a control circuit, reference numeral 1305 denotes a display, and reference numeral 1300 denotes a liquid crystal display apparatus. The display 1305 receives a plurality of wavelength lights outputted from the laser light source 1301, and is provided with an image conversion element 1303 such as a liquid crystal panel as a two-dimensional switch and a wave-guide plate (not illustrated) disposed on the back side of the liquid crystal panel (image conversion element) 1303 for diffusing output light from the laser light source. The laser light from the laser light source 1301 is used as a light source for back light of the laser display 1305.

The laser light source 1301 comprises a pump light source as a GaN laser and a doped fiber comprising a plurality of fibers, and back light is constructed by such that RGB lights including red light and green light that are outputted from the doped fiber and blue light from the pump light source are diffused by the wave-guide plate disposed at the back of the liquid crystal panel 1303, and uniformly irradiating thereof to the liquid crystal panel 1303.

As described above, if the laser light source of the present invention is used in the liquid crystal display apparatus 1300, a display apparatus having very broad color reproducibility can be realized. Further, by using the laser light source of the present invention, wavelength spectrum is broadened and speckle noises are reduced. Accordingly high image-quality video can be displayed.

Meanwhile, in the liquid crystal display apparatus 1300, since the laser light source 1301 for generating a plurality of wavelength lights such as RGB lights at the same time is used as a laser light source, the output ratio of the RGB lights is likely to be affected by outside temperature or environmental changes. Accordingly, variation in colors is likely to occur. In order to prevent this, the liquid crystal display 1300 further comprises the control circuit 1304.

The control circuit 1304 detects output intensities of the RGB lights outputted from the laser light source 1301, and, in accordance with the detected values, controls the transmittance of each of RGB lights by the liquid crystal panel (image conversion element) 1303 thereby to control the intensity and the output ratio of each of the RGB lights outputted from the liquid crystal panel 1303. Therefore, stable and highly vivid video can be displayed on the display 1305 in a highly reproducible manner.

Furthermore, in FIG. 22, since the display 1305 is separated from the laser light source 1, and is lightweight and thin, a large display which can be hung on a wall can be realized.

Figure 23:
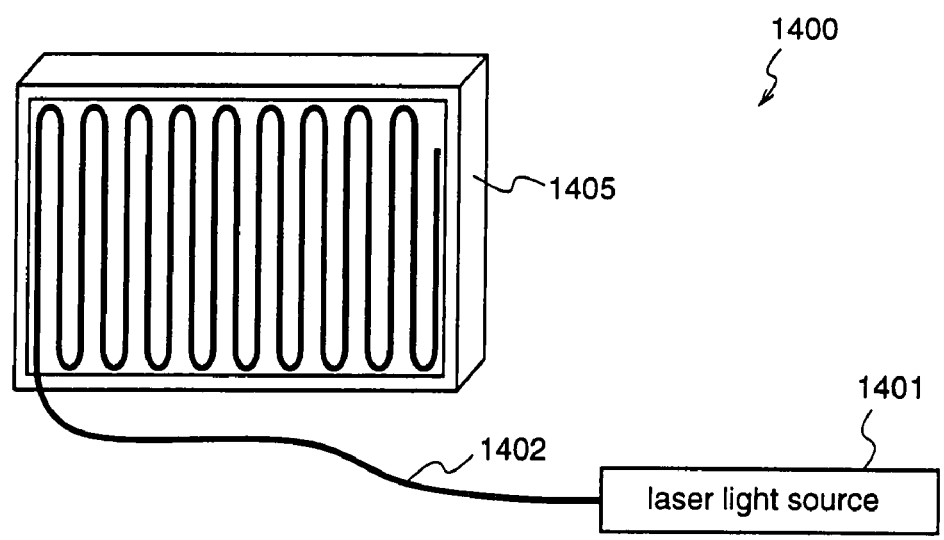
FIG. 23 . . .

Further, there is a construction shown in FIG. 23 as another construction of the liquid crystal display apparatus.

FIG. 23 is a diagram illustrating another construction of the liquid crystal display apparatus according to this seventh embodiment. In the figure, reference numeral 1401 denotes the laser light source of the present invention for outputting a plurality of wavelength lights, reference numeral 1402 denotes a fiber, reference numeral 1405 denotes a display, and reference numeral 1400 denotes a liquid crystal display apparatus.

Here, liquid crystal back light is constructed by using side scattering of the fiber 1402. In particular, as shown in FIG. 23, the fiber 1402 is paved on the back of the display 1405, and a liquid crystal panel such as an image conversion element (not illustrated) is irradiated by the side scattering from the fiber 1402 so as to construct the back light.

A visible light generation fiber doped with $Pr^{3+}$ has large scattering and is apparent in phenomenon that laser is irradiated from the sides of the fiber. Consequently, here, a $Pr^{3+}$ doped fiber is used as the fiber 1402, and back light is constructed by the scattering from the sides of the fiber 1402.

As described above, the fiber 1402 is a $Pr^{3+}$ doped fiber and red light and green light are generated therein, thereby simultaneous generation of RGB lights including GaN laser of a pump light source provided in the laser light source 1401 is possible. Scatterers for scattering generated light are slightly contained in the clad of the fiber 1402, and irradiate red light and green light which are generated at the core and blue light from the GaN laser 1 transmitted through the clad to the sides.

By using this as back light, the liquid crystal display apparatus 140 can be realized. Further, the fiber diameter is very small as several hundred μm, a thin type back light can be realized, and even if it is combined with a liquid crystal panel, a super-thin type display can be realized.

Meanwhile, in this seventh embodiment, though the optical device was described by taking a laser display and a liquid crystal display as examples, the present invention is also effective for a measuring device.

INDUSTRIAL APPLICABILITY

The laser light source of the present invention is useful as a small laser light source which can output high power and low coherent light. Further, the optical device using the laser light source is useful for improving the picture quality of two-dimensional image.

The invention claimed is:

1. A laser light source comprising:
a pump light source comprising a semiconductor laser;
a solid laser medium for excitation by light from the pump light source, wherein said solid laser medium is co-doped with $Pr^{3+}$ and $Ho^{3+}$, each at 1~3 %, and the oscillation wavelength of the solid laser medium is red light of 600-660 nm, or green light of 515-555 nm;
and multi-mode means for changing at least one of a longitudinal mode or a transverse mode of laser oscillation of the solid laser medium, into a multi-mode, wherein the multi-mode means for changing the longitudinal mode of the oscillation wavelength of the laser medium into a multi-mode is an oversaturation absorber having a thermal lens effect for changing the transverse mode of the oscillation wavelength of the laser medium into a multi-mode, thereby the longitudinal mode and the transverse mode of the oscillation wavelength of the laser medium are changed into a multi-mode.

2. The laser light source as defined in claim 1, wherein the solid laser comprises a ceramic material.

3. The laser light source as defined in claim 1 further comprises a reflector having a narrow-band reflection characteristics,
wherein the reflector fixes the oscillation wavelength of the semiconductor laser to a wavelength thereof.

4. The laser light source as defined in claim 1, wherein the solid laser medium comprises a fiber having a double-clad structure.

5. The laser light source as defined in claim 1, wherein the solid laser medium comprises an optical wave-guide.

6. The laser light source as defined in claim 1 comprises a seed light source comprising the pump light source, the solid laser medium, and the multi-mode means and a fiber for excitation by light from the pump light source,
and for amplification by the fiber of seed light outputted from the seed light source.

7. The laser light source as defined in claim 1, wherein the solid laser medium simultaneously generates any of red light of an oscillation wavelength of 600-660nm, green light of an oscillation wavelength of 515-555nm, and blue light of an oscillation wavelength of 440nm,
the pump light source is GaN solid light source, and
high frequencies are superposed onto output light of the semiconductor laser.

8. The laser light source as defined in claim 4, wherein the fiber has a plurality of cores.

9. The laser light source as defined in claim 8, wherein either of the diameters of the plurality of cores and distances between the cores is different, or either of the plurality of cores has a reflective index different from the other cores.

10. The laser light source as defined in claim 8, wherein either of the plurality of cores includes an additive different from the other cores or has an amount of additive different from the other cores.

11. The laser light source as defined in claim 8 further comprises a tapered fiber for widening the core diameter of the fiber in the vicinity of the output portion of the fiber.

12. The laser light source as defined in claim 8 comprises at least one seed light source, wherein seed light outputted from the seed light source is amplified by the fiber.

13. The laser light source as defined in claim 4, wherein the solid laser medium comprises a plurality of fibers having the double-clad structure,
   either of the plurality of fibers generates a wavelength different from the other fibers, and
   either of the plurality of fibers generates a plurality of wavelength lights.

14. The laser light source as defined in claim 13, wherein either of the plurality of fibers has a plurality of cores.

15. The laser light source as defined in claim 13 further comprises a heat sink for cooling the plurality of fibers, wherein at least a part of the fiber is in contact with the heat sink.

16. An optical device comprising:
   a red laser light source for generating red coherent light;
   a green coherent light source for generating green coherent light;
   a blue coherent light source for generating blue coherent light; and
   an optical system for irradiating a laser beam onto a screen or an irradiation body,
   wherein at least one of the red laser light source, the green laser light source, and the blue laser light source is the light source as defined in claim 1.

17. An optical device comprising:
   the laser light source as defined in claim 8;
   an image converter element for converting a plurality of wavelength lights outputted from the laser light source into an image to be displayed on a display; and
   a control circuit for detecting the output strengths of the plurality of wavelength lights which are generated from the laser light source, and controlling the respective strengths and the output ratios of the plurality of wavelength lights outputted from the image converter element in accordance with the output strengths.

18. An optical device as defined in claim 17, wherein a fiber for transmitting light from the laser light source to the display includes scatterers for scattering light that wave-guides the fiber in its clad, and
   the image converter element is irradiated by side scattering from the fiber.

19. A laser light source comprising:
   a pump light source comprising a semiconductor laser;
   a solid laser medium excited by the pump light source, wherein said solid laser medium is co-doped with $Pr^{3+}$ and at least one of $Eu^{3+}$, $Sm^{3+}$, $Ce^{3+}$, $Tb^{3+}$, and $Eu^{2+}$; and the oscillation wavelength of the solid laser medium is red light of 600-660 nm, or green light of 515-555 nm;
   and multi-mode means for changing at least one of a longitudinal mode or a transverse mode of laser oscillation of the solid laser medium, into a multi-mode, wherein the multi-mode means for changing the longitudinal mode of the oscillation wavelength of the laser medium into a multi-mode is an over-saturation absorber having a thermal lens effect for changing the transverse mode of the oscillation wavelength of the laser medium into a multi-mode, thereby the longitudinal mode and the transverse mode of the oscillation wavelength of the laser medium are changed into a multi-mode.

20. The laser light source as defined in claim 19, wherein the solid laser medium comprises a fiber having a double-clad structure.

21. The laser light source as defined in claim 19, wherein the solid laser medium comprises an optical wave-guide.

22. The laser light source as defined in claim 19 comprises a seed light source comprising the pump light source, the solid laser medium, and the multi-mode means and a fiber for excitation by light from the pump light source,
   and for amplification by the fiber of seed light outputted from the seed light source.

* * * * *